(12) United States Patent
Chang et al.

(10) Patent No.: US 12,484,299 B2
(45) Date of Patent: Nov. 25, 2025

(54) INTEGRATED CIRCUIT STRUCTURE WITH GATE STRUCTURES ON GRIDS AND METHOD FOR FORMING THE SAME

(71) Applicant: TAIWAN SEMICONDUCTOR MANUFACTURING COMPANY, LTD., Hsinchu (TW)

(72) Inventors: Yung Feng Chang, Hsinchu (TW); Tung-Heng Hsieh, Hsinchu County (TW); Bao-Ru Young, Hsinchu County (TW); Pi-Yun Sun, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 444 days.

(21) Appl. No.: 17/400,310

(22) Filed: Aug. 12, 2021

(65) Prior Publication Data
US 2023/0052954 A1 Feb. 16, 2023

(51) Int. Cl.
*H10D 84/85* (2025.01)
*H01L 21/02* (2006.01)
(Continued)

(52) U.S. Cl.
CPC ....... *H10D 84/856* (2025.01); *H01L 21/0259* (2013.01); *H10D 30/031* (2025.01); *H10D 30/6735* (2025.01); *H10D 30/6757* (2025.01); *H10D 62/118* (2025.01); *H10D 64/017* (2025.01); *H10D 64/018* (2025.01);
(Continued)

(58) Field of Classification Search
CPC ............. H01L 27/0922; H01L 21/0259; H01L 21/8238; H01L 21/823814; H01L 21/82385; H01L 21/823864; H01L 21/823871; H01L 29/0665; H01L 29/42392; H01L 29/66545; H01L 29/66553; H01L 29/66742; H01L 29/78696; H10D 84/856; H10D 84/0186; H10D 30/6757; H10D 64/018; H10D 64/017; H10D 62/118; H10D 84/0167; H10D 84/0184; H10D 30/6735;
(Continued)

(56) References Cited

U.S. PATENT DOCUMENTS

2017/0012126 A1* 1/2017 Chu-Kung ........ H01L 29/78696
2019/0355851 A1* 11/2019 Seshadri ............... H01L 27/088
(Continued)

*Primary Examiner* — Norman D Richards
*Assistant Examiner* — Sean Ayers Winters
(74) *Attorney, Agent, or Firm* — Birch, Stewart, Kolasch & Birch, LLP

(57) ABSTRACT

The integrated circuit (IC) structure includes a semiconductor substrate, a first active region, a dummy fill region, a second active region, first metal gate structures, and second metal gate structures. The first active region is on the semiconductor substrate. The dummy fill region is on the semiconductor substrate. The second active region is on the semiconductor substrate and spaced apart from the first active region by the dummy fill region. The first metal gate structures extend in the first active region and have a first gate pitch and a first gate width. The second metal gate structures extend in the second active region and have a second gate width greater than the first gate width and a second gate pitch being an integer times the first gate pitch, and the integer being two or more.

20 Claims, 25 Drawing Sheets

(51) Int. Cl.
*H10D 30/01* (2025.01)
*H10D 30/67* (2025.01)
*H10D 62/10* (2025.01)
*H10D 64/01* (2025.01)
*H10D 84/01* (2025.01)
*H10D 84/03* (2025.01)

(52) U.S. Cl.
CPC ....... *H10D 84/0167* (2025.01); *H10D 84/017* (2025.01); *H10D 84/0179* (2025.01); *H10D 84/0184* (2025.01); *H10D 84/0186* (2025.01); *H10D 84/038* (2025.01)

(58) Field of Classification Search
CPC .. H10D 84/017; H10D 84/038; H10D 30/031; H10D 84/0179
See application file for complete search history.

(56) References Cited

U.S. PATENT DOCUMENTS

2020/0035563 A1* 1/2020 Zhang ............... H01L 29/66439
2020/0066725 A1* 2/2020 Bhuwalka ............ H10D 62/121

* cited by examiner

INTEGRATED CIRCUIT STRUCTURE WITH GATE STRUCTURES ON GRIDS AND METHOD FOR FORMING THE SAME

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
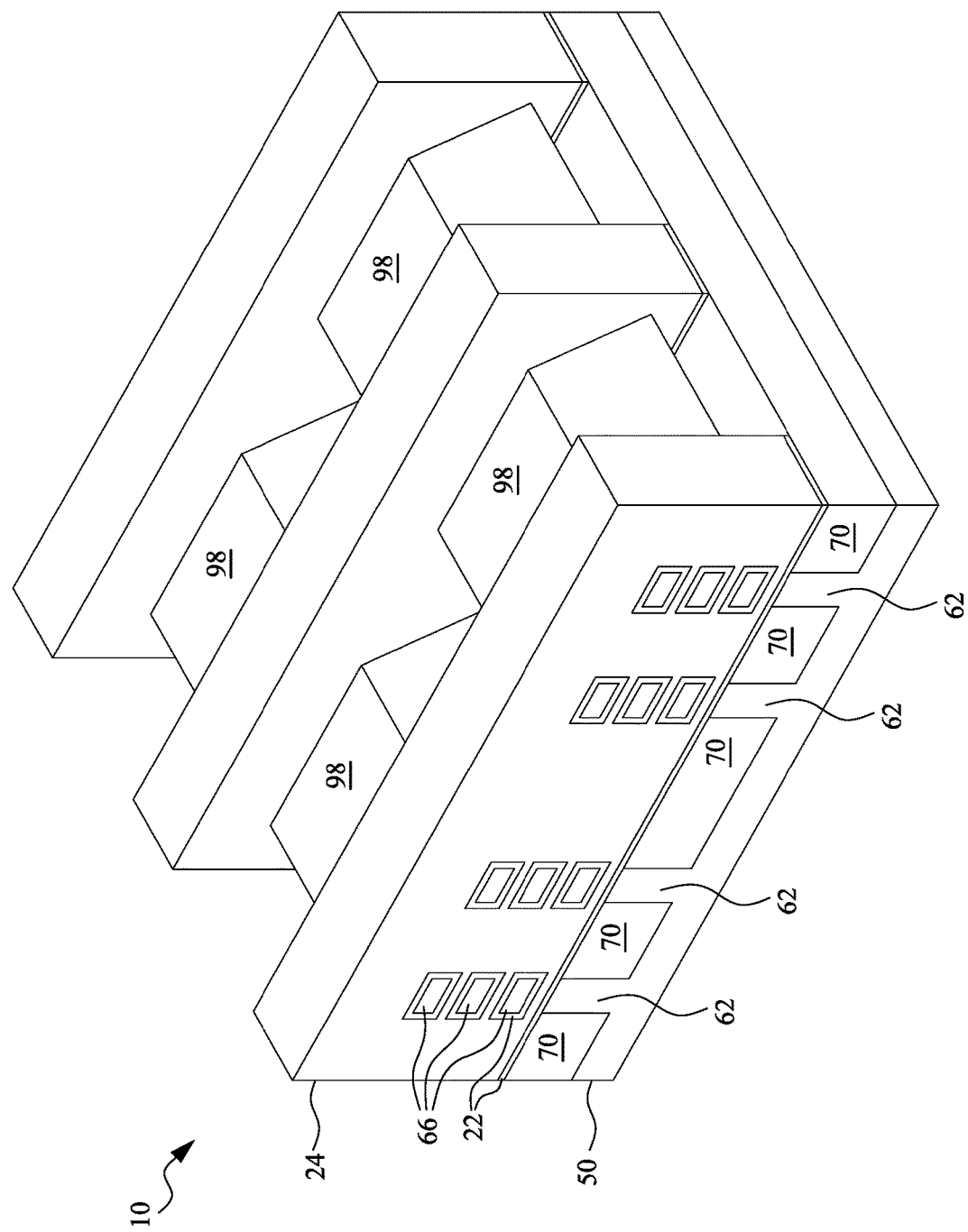
FIG. 1 illustrates a perspective view of a schematic nanostructure field-effect transistor (nano-FET) in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 180 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

In order to reducing process variations in the IC structure, dummy patterns are inserted into IC structure to reduce pattern loading effect. For example, dummy fill region with non-functional gate structures may be inserted into the IC structure to create more uniform density of active areas in the IC structure. However, in current gate layout design, metal gate structures may not be uniformly distributed. For example, some metal gate structures with narrower gate width are routed on-grid (i.e., aligned with grid lines), but others metal gate structures with wider gate width are routed off-grid (i.e., offset from grid lines). In order to avoid collision between the non-functional gate structures and the off-grid wider metal gate structures, the dummy fill region may be set farther away from the off-grid metal gate structures and thus results in a large gate-free region separating the off-grid gates and the dummy fill region, which in turn aggravates the CMP loading effect. For example, the CMP serving to remove excessive metal gate materials may result in more dishing in pattern-sparse regions (e.g., the large gate-free region between the off-grid gates and the dummy fill region) than in pattern-dense region (e.g., gate-to-gate region between neighboring gates).

Therefore, the present disclosure in various embodiments provides the wider metal gate structures and the narrower gate structures both routed on grid. As a result, the dummy fill region can be set close to the wider gate structures, which in turn reduces the gate-free region between the dummy fill region and the wider gate structures, thus reducing the CMP loading effect.

FIG. 1 illustrates a perspective view of a schematic nanostructure field-effect transistor (nano-FET) 10 in accordance with some embodiments of the present disclosure, where some features of the nano-FETs 10 are omitted for illustration clarity. The nano-FETs 10 may be nanosheet field-effect transistors (NSFETs), nanowire field-effect transistors (NWFETs), gate-all-around field-effect transistors (GAAFETs), or the like. The nano-FETs 10 may include nanostructures 66 (e.g., nanosheets, nanowires, or the like) over fins 62 on a substrate 50 (e.g., a semiconductor substrate), with the nanostructures 66 acting as channel regions for the nano-FETs 10. The nanostructures 66 may include p-type nanostructures, n-type nanostructures, or a combination thereof. Isolation regions 70, such as shallow trench isolation (STI) regions, are disposed between adjacent fins 62, which may protrude above and from between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials. In this context, the fins 62 refer to the portion extending above and from between the adjacent isolation regions 70.

In FIG. 1, gate dielectrics 22 are over top surfaces of the fins 62 and along top surfaces, sidewalls, and bottom surfaces of the nanostructures 66. Gate electrodes 24 are over the gate dielectrics 22. Epitaxial source/drain regions 98 are disposed on the fins 62 at opposing sides of the gate dielectrics 22 and the gate electrodes 24. The epitaxial source/drain regions 98 may be shared between various fins 62. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

Some embodiments discussed herein are discussed in the context of nano-FETs 10 formed using a gate-last process. In other embodiments, a gate-first process may be used. Also, some embodiments contemplate aspects used in planar devices, such as planar FETs or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

Figure 2A:
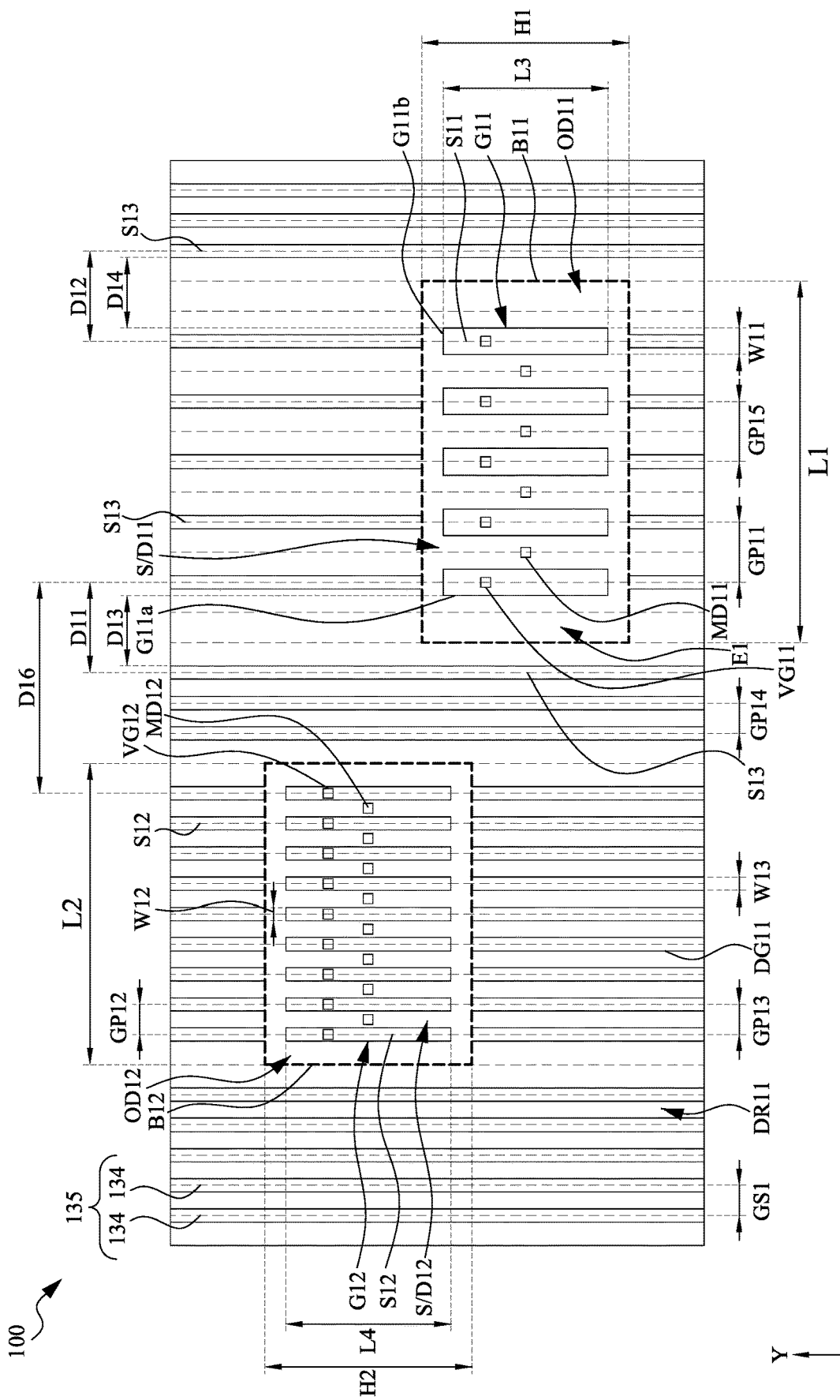
FIGS. 2A to 2C illustrate top views of different integrated circuit structure corresponding to design grids in accordance with some embodiments of the present disclosure.

FIG. 2A illustrates a top view of an integrated circuit structure 100 with nanostructure field-effect transistor as shown in FIG. 1 corresponding to a design grid in accordance with some embodiments of the present disclosure. As shown in FIG. 2A, a design grid 135 may be at least formed of vertical grid lines 134. The vertical grid lines 134 may also have a uniform grid spacing GS1, which is the center-to-center distance between neighboring vertical grid lines 134. In some embodiments, all of the circuit regions such as active regions OD11 and OD12 inside the circuit regions have their vertical boundaries B11 and B12 falling on the vertical grid lines 134 for design alignment. Accordingly, the active region lengths L1 and L2 of the active regions OD11 and OD12 are designed to be substantially equal to the integer times the grid spacing GS1. In some embodiments, the active region OD11 extends through twelve times grid spacing GS1, and the active region OD12 extends through ten times grid spacing GS1. In some embodiments, the length L1 of the active region OD11 may be greater than, equal to, or smaller the length L1 of the active region OD12. In some embodiments, the active region OD may have a length H1 greater than, equal to, or smaller than a length H2 of the active region OD12.

In some embodiments, the active regions OD11 and OD12 may include transistors a variety of active devices, such as P-channel field effect transistors (PFETs), N-channel field effect transistors (NFETs), metal-oxide semiconductor field effect transistors (MOSFETs), complementary metal-oxide semiconductor transistors (CMOSs), bipolar transistors, high voltage transistors, high frequency transistors, and/or combinations thereof formed on the active region OD11. In some embodiments, when the transistors are nanostructure field-effect transistors as shown in FIG. 1, the corresponding active regions of the nanostructure field-effect transistors may include nanosheet channels, which have lengthwise directions in the X-direction. In subsequently discussed examples, the nanosheet channels are used as the examples of the active regions OD11 and OD12 of the transistors. In some embodiments, the active regions OD11 and OD12 may include planar transistors, FinFETs, or the like.

In FIG. 2A, the active regions OD11 and OD12 include metal gate structures G11 and G12 extending therein along the Y-direction perpendicular to the X-direction. The metal gate structures G11 and G12 each has a strip shape from a top view and may be thus interchangeably referred to as metal gate strips in this context. In some embodiments, the metal gate structures G11 are formed simultaneously with the metal gate structures G12. In the depicted embodiment as illustrated in FIG. 2A, the metal gate structures G11 in the active region OD11 each has a gate width W11 measured in the X-direction, and the metal gate structures G12 in the active region OD12 each has a gate width W12 measured in the X-direction and less than the gate width W11.

As shown in FIG. 2A, the metal gate structures G11 are equidistantly arranged in a first row along the X-direction at a gate pitch GP11 (i.e., center-to-center spacing between neighboring metal gate structures), and the metal gate structures G12 are equidistantly arranged in a second row along the X-direction at a gate pitch GP12 (i.e., center-to-center spacing between neighboring metal gate structures). In some embodiments, all of the metal gate structures G11 and G12 in the active regions OD11 and OD12 have their longitudinal axes S11 and S12 falling on the vertical grid lines 134 for design alignment. Accordingly, the gate pitches GP11 and GP12 of the metal gate structures G11 and G12 in the active regions OD11 and OD12 are designed to be substantially equal to the integer times the grid spacing GS1.

The gate pitch GP11 of the metal gate structures G11 may be in correlation with the gate pitch GP12 of the metal gate structures G12 and be integer times the gate pitch GP12 of the metal gate structures G12, such as about twice of the gate pitch GP12 as shown in FIG. 2A. In some embodiments, the gate pitch GP12 may be less than about four times the gate pitch GP11, such as about three times, twice, or the same. In some embodiments, the gate pitch GP11 of the gate structures G11 spans two grid spacings GS1, and the gate pitch GP12 of the gate structures G12 spans a grid spacing GS1. Therefore, the gate pitch GP12 of the gate structures G11 may be greater than about twice the gate pitch GP12 of the gate structures G12, but by way of example but not limit the present disclosure. In some embodiments, the longitudinal axes S12 of the metal gate structures G12 may be laterally offset from the longitudinal axes S11 of the metal gate structures G11 by an integer times the gate pitch GP11 of the gate structures G11 as shown in FIG. 2A. In some embodiments, the gate structures G11 may have a length L3 greater than, equal to, or smaller than a length L4 of the gate structures G12.

In FIG. 2A, the active regions OD11 and OD12 further include a plurality of gate contacts VG11 and VG12 over the corresponding metal gate structures G11 and G12, respectively. The gate contacts VG11 may be formed simultaneously with the gate contacts VG12. In some embodiments, the gate contacts VG11 and VG12 may include a conductive material such as, for example, copper (Cu), tungsten (W) cobalt (Co) or other suitable metals. Formation of the gate contacts VG11 and VG12 may include, for example, etching contact openings in an interlayer dielectric (ILD) layer (not shown) over the metal gate structures G11 and G12, depositing one or more conductive materials in the contact openings, and planarizing the one or more conductive materials by using, for example, a CMP process. By way of example and not limitation, the gate contacts VG11 and VG12 are square patterns with a fixed size depending on the process. The gate contacts VG11 and VG12 are aligned with each other across multiple metal gate structures G11 and G12 from the top-view shown in FIG. 2A. In some embodiments, the gate contacts VG11 and VG12 may have a staggered arrangement across the multiple gate structures G11 and G12 from the top-view.

In FIG. 2A, the active regions OD11 and OD12 further includes a plurality of source/drain regions S/D11 and S/D12. The source/drain regions S/D11 and S/D12 are doped semiconductor regions located on opposite sides of the corresponding metal gate structures G11 and G12. In some embodiments, the source/drain regions S/D11 and S/D12 include p-type dopants or impurities such as boron for forming functional p-type FETs in the active regions OD11 and OD12. In some embodiments, the source/drain regions S/D11 and S/D12 include n-type dopants or impurities such as phosphorus for forming functional n-type FETs in the active regions OD11 and OD12. In some embodiments, the source/drain regions S/D11 and S/D12 may be epitaxially grown regions. For example, gate spacers (not shown) may be formed alongside sacrificial gate structures (which will be replaced with the metal gate structures G11 and G12) by depositing a spacer material and anisotropically etching the spacer material, and subsequently, the source/drain regions S/D11 and S/D12 may be formed self-aligned to the spacers 120 by first etching the active regions OD11 and OD12 to form recesses, and then depositing a crystalline semiconductor material in the recesses by a selective epitaxial growth (SEG) process that may fill the recesses in the active regions OD11 and OD12 and may extend further beyond the original surface of the active regions OD11 and OD12 to form raised source/drain epitaxy structures in some embodiments. The crystalline semiconductor material may be an elemental semiconductor (e.g., Si, or Ge, or the like), or an alloy semiconductor (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of n-type or p-type dopants may be introduced into source/drain regions S/D11 and S/D12 either in situ during SEG, or by an ion implantation process performed after the SEG, or by a combination thereof. In FIG. 2A, the active regions OD11 and OD12 further includes a plurality of source/drain contacts MD11 and MD12 landing on the respective source/drain regions S/D11 and S/D12 within the active regions OD11 and OD12. In some embodiments, the source/drain contacts MD11 and MD12 includes suitable one or more metals, such as W, Cu, Cu, the like or combinations thereof.

In FIG. 2A, a dummy fill region DR11 is formed inside the circuit regions and laterally surrounds the active regions OD11 and OD12 when in a plan view. The pattern loading effect of the integrated circuit structure 100 can be prevented from tuning by designing non-functional gate layout patterns on the dummy fill region DR11. In other words, the non-functional gate structures DG11 in the dummy fill region DR11 may aid in preventing pattern loading effect during fabrication processes of the metal gate structures G11 and G12 (e.g. loading effect (e.g., dishing) occurring in a CMP process used to remove excessive gate metal materials in the active regions OD11 and OD12). In some embodiments, the non-functional gate structure DG11 can be interchangeably referred to as a dummy gate structure. In some embodiments, the dummy fill region DR11 may include a variety of passive devices, such as capacitors and other passive devices such as resistors, inductors, fuses, or other suitable passive devices. In certain embodiments of the present disclosure, the integrated circuit structure 100 includes non-functional gate transistors formed in the dummy fill region DR11.

In some embodiments, the non-functional gate structures DG11 on the dummy fill region DR11 form non-functional or dummy transistors (i.e., transistor-like structures not functioned to create channels in the passive region), while the metal gate structures G11 and G12 in the active regions OD11 and OD12 form functional transistors (i.e., transistors functioned to create channels in the active regions OD11 and OD12). In some embodiments, the non-functional gate structures DG11 are electrically floating (e.g., without any gate contact on their top surfaces). The non-functional transistors may be nanostructure field-effect transistors as shown in FIG. 1 with nanosheet structures, which have lengthwise directions in the X-direction. In subsequently discussed examples, the nanosheet structures are used as the examples of the dummy fill region DR11 of the non-functional transistors. In some embodiments, the dummy fill region DR11 may include non-functional planar transistors, non-functional FinFETs, or the like.

In FIG. 2A, the non-functional gate structures DG on the dummy fill region DR11 extend along the Y-direction perpendicular to the X-direction. The non-functional gate structures DG each has a strip shape from a top view and may be thus interchangeably referred to as non-functional gate strips in this context. In some embodiments, the non-functional gate structures DG11 are formed simultaneously with the metal gate structures G11 and G12 in the active regions OD11 and OD12, and thus non-functional gate structures DG11 can be formed without using additional processes and hence additional cost. Because of simultaneous formation of the non-functional gate structures DG11 are formed of same material(s) as the metal gate structures G11 and G12. For example, at the time the metal gate structures G11 and G12 on the active regions OD11 and OD12 are formed, the non-functional gate structures DG11 on the dummy fill region DR11, which includes a dielectric layer and one or more metal layers as the metal gate structures G11 and G12, are also formed simultaneously. In some embodiments, the non-functional gate structures DG11 and metal gate structures G11 and G12 can be formed on the same level height.

In the depicted embodiment as illustrated in FIG. 2A, longitudinal axes S13 of the non-functional gate structures DG11 may be respectively aligned with longitudinal axes S11 and S12 of the metal gate structures G11 or G12 in the Y-direction. That is, the metal gate structures G11 and G12 in the active regions OD11 and OD12 and the non-functional gate structures DG11 in the dummy fill region DR11 are respectively on the vertical grid lines 134 of the design grid 135. In other words, virtual extension lines of the longitudinal axes S11 and S12 of the metal gate structures G11 and G12 may overlap with the longitudinal axes S13 of the non-functional gate structure DG11. In this configuration, the non-functional gate structures DG11 and the corresponding metal gate structures G11 and G12 can be formed by using a gate cut process. The resultant functional and non-functional gate structures are both placed "on-gird." By way of example and not limitation, fabrication of the non-functional gate structure DG and the metal gate structures G11 and G12 may include forming as a single continuous HKMG strip extending along the Y-direction from top view, followed by etching the single continuous HKMG strip to break it into separate strips that respectively serve as the non-functional gate structure DG11 and the metal gate structures G11 and G12.

In order to reducing process variations in the integrated circuit structure 100, the dummy fill region DR11 with non-functional gate structures DG11 may be inserted into the integrated circuit structure 100 to create more uniform density of active areas in the integrated circuit structure 100. However, in current gate layout design, metal gate structures may not be uniformly distributed. For example, some metal gate structures with narrower gate width are routed on-grid (i.e., aligned with grid lines 134), but others metal gate structures with narrower gate width are routed off-grid (i.e., offset from grid lines 134). In order to avoid collision between the non-functional gate structures and the off-grid wider metal gate structures, the dummy fill region may be set farther away from the off-grid metal gate structures and thus results in a large gate-free region, which in turn aggravates the CMP loading effect.

Therefore, the present disclosure in various embodiments provides the wider metal gate structures G11 and the narrower gate structures G12 both routed on-grid (i.e., both aligned with corresponding grid lines 134). As a result, the dummy fill region DR11 can be set close to the wider gate structures G11, which in turn reduces the gate-free region between the dummy fill region DR11 and the wider gate structures G11, thus reducing the CMP loading effect.

As shown in FIG. 2A, the non-functional gate structures DG11 located on opposite sides of the active region OD12 along the Y-direction are arranged in a row along the X-direction at a gate pitch GP13 (i.e., center-to-center spacing between neighboring gate structures), the non-functional gate structures DG11 located between the active regions OD11 and OD12 are arranged in a row along the X-direction at a gate pitch GP14 (i.e., center-to-center spacing between neighboring non-functional gate structures), and the non-functional gate structures DG located on opposite sides of the active region OD11 along the Y-direction are arranged in a row along the X-direction at a gate pitch GP15 (i.e., center-to-center spacing between neighboring gate structures). In some embodiments, all of the non-functional gate structures DG11 in the dummy fill region DR11 have their longitudinal axes S13 falling on the vertical grid lines 134 for design alignment. Accordingly, the gate pitches GP13, GP14, and GP15 of the non-functional gate structures DG may be in correlation with the grid spacing GS1.

As shown in FIG. 2A, the gate pitches GP13, GP14, and GP15 of the non-functional gate structures DG11 in the dummy fill region DR11 are designed to be substantially equal to the integer times the grid spacing GS1. In some embodiments, the gate pitch GP13 of the non-functional gate structures DG spans a grid spacing GS1, the gate pitch GP14 of the non-functional gate structures DG11 spans one grid spacing GS1, and the gate pitch GP15 of the non-functional gate structures DG11 spans two grid spacings GS1.

As shown in FIG. 2A, the gate pitches GP13 and GP14 of the non-functional gate structures DG11 may substantially the same as the gate pitch GP12 of the gate structures G12, and the gate pitch GP15 of the non-functional gate structures DG11 may substantially the same as the gate pitch GP11 of the gate structures G11, but way of example but not limit the present disclosure. On the other hands, the gate pitch GP15 of the non-functional gate structures DG11 may be integer times the gate pitches GP3 and GP4, such as about twice of the gate pitch GP12. The gate pitch GP11 of the metal gate structures G11 may be integer times the gate pitches GP13 and GP14, such as about twice of the gate pitch GP12. In some embodiments, the gate pitches GP13 and GP14 may be less than about three times the gate pitch GP11, such as about twice or the same. In some embodiments, the gate pitch GP15 of the non-functional gate structures DG11 may be less than the gate pitch GP11 of the gate structures G11 for reducing pattern loading effect during fabricating the metal gate structures G11 and G12 (e.g. loading effect (e.g., dishing) occurring in a CMP process used to remove excessive gate metal materials). In some other embodiments where the integrated circuit structure 100 has more relaxed requirements about the loading effect in fabrication of the metal gate structures G11 and G12, the gate pitches GP13, GP14, and GP15 may be greater or less than the gate pitches GP11 and GP12 of the metal gate structures G11 and G12.

Width of the non-functional gate structures DG11 may also aid in preventing pattern loading effect during fabrication processes of the metal gate structures G11 and G12. In the depicted embodiment as illustrated in FIG. 2A, the non-functional gate structures DG11 in the dummy fill region DR11 each has a gate width W13 measured in the X-direction and substantially the same as the gate width W12 of the metal gate structure G12 and less than the gate width W11 of the metal gate structure G11. In some other embodiments where the integrated circuit structure 100 has more relaxed concern about the loading effect in fabrication of the metal gate structures G11 and G12, the gate width W13 of the non-functional gate structures DG11 may be greater than or equals to the gate width W11 or W12 of the metal gate structure G11 or G12. In this way, the pattern loading effect of the integrated circuit structure 100 can be prevented from tuning by designing non-functional gate layout patterns.

In FIG. 2A, the nanostructure field-effect transistors on the active region OD11 is symmetrical to the longitudinal axis S11 of the center one of the metal gate structures G11 and the nanostructure field-effect transistors on the active region OD12 is symmetrical to the longitudinal axis S12 of the center one of the metal gate structures G12 from the top view. In some embodiments, the longitudinal axis S11 of the outermost metal gate structure G11a in the active region OD11 has a distance D11 to the longitudinal axis S13 of the non-functional gate structure DG11, the longitudinal axis S11 of the outermost metal gate structure G11b in the active region OD has a distance D12 to the longitudinal axis S13 of the non-functional gate structure DG11, and the distance D11 may be substantially the same as the distance D12. Because the metal gate structures G11 and G12 in the active regions OD11 and the non-functional gate structure DG11 in the dummy fill region DR11 have their longitudinal axes S11, S12, and S13 falling on the vertical grid lines 134, the distance D11 and D12 may be substantially equal to the integer times the grid spacing GS1 or the gate pitch GP12 of the metal gate structures G12, such as about three times the grid spacing GS1 or the gate pitch GP12 of the metal gate structures G12 as shown in FIG. 2A. In some embodiments, the distance D11 and D12 may be less than about three times the grid spacing GS1 or the gate pitch GP12, such as about twice or the same. In some embodiments, longitudinal axes of the non-functional gate structure DG11 are laterally offset from the longitudinal axes of the metal gate structures G11 and the longitudinal axes of the metal gate structures G12 by an integer times the gate pitch GP11 of the gate structures G11 as shown in FIG. 2A.

In some embodiments, the outermost metal gate structure G11a in the active region OD11 has a distance D13 to the non-functional gate structure DG11, the outermost metal gate structure G11b in the active region OD11 has a distance D14 to the non-functional gate structure DG11, and the distances D13 and D14 may be less than about three times the grid spacing GS1 or the gate pitch GP12. In FIG. 2A, the longitudinal axis S11 of the outermost metal gate structure G11a in the active region OD has a distance D16 to the longitudinal axis S12 of the longitudinal axis S12 of the outermost one of metal gate structure G12 in the active region OD12. The distance D16. Because the metal gate structures G11 and G12 have their longitudinal axes S11 and S12 falling on the vertical grid lines 134, the distance D16 may be integer times the grid spacing GS1, such as 7 times the grid spacing GS1, by way of example but not limiting the present disclosure.

In some embodiments, a PO empty space E1 may be defined between the outermost metal gate structures G11a and G11b and the vertical boundary B11 of the active region OD11, where is no gate structure passing through this space. Because the metal gate structures G11 in the active region OD11 and the non-functional gate structure DG11 in the dummy fill region DR11 have their longitudinal axes S11 and S13 falling on the vertical grid lines 134, the PO empty space E1 can be minimized, which in turn allows for adding the space for the dummy fill region DR11 surrounding the active regions OD11 and OD12, so as to improve the pattern density of the non-functional gate structures DG11 in the dummy fill region DR11. Therefore, the improved pattern density of the non-functional gate structures DG11 on the dummy fill region DR11 can prevent pattern loading effect during fabrication processes of the metal gate structures G11 and G12 occurring in a CMP process. In some embodiments, a Y-dimension of the PO empty space E1 may be substantially the same as the length H1 of the active region OD11 and may be in a range from about 2.5 μm to about 3.5 μm, such as 2.5, 3, or 3.5 μm, and a X-dimension of the PO empty space E1 may be substantially the same as a distance between a longitudinal side of the outermost metal gate structure G11a and the vertical boundary B11 of the active region OD11 and may be in a range from about 0.2 μm to about 0.4 μm, such as 0.2, 0.25, 0.267, 0.3, 0.35, or 0.4 μm, by way of example but not limiting the present disclosure.

The metal gate structures G11 and G12 in the active regions OD11 and OD12 and the non-functional gate structures DG11 in the dummy fill region DR11 of the present disclosure respectively falling on the vertical grid lines 134 of a design grid 135. An advantage is that such the IC structure 100 can be planarized more quickly, e.g., because the increased structural density reduces irregularities in surface topography. In another example, a chemical mechanical planarization (CMP) process may be applied to the IC structure IOU to achieve a globally planarized surface.

Figure 2B:
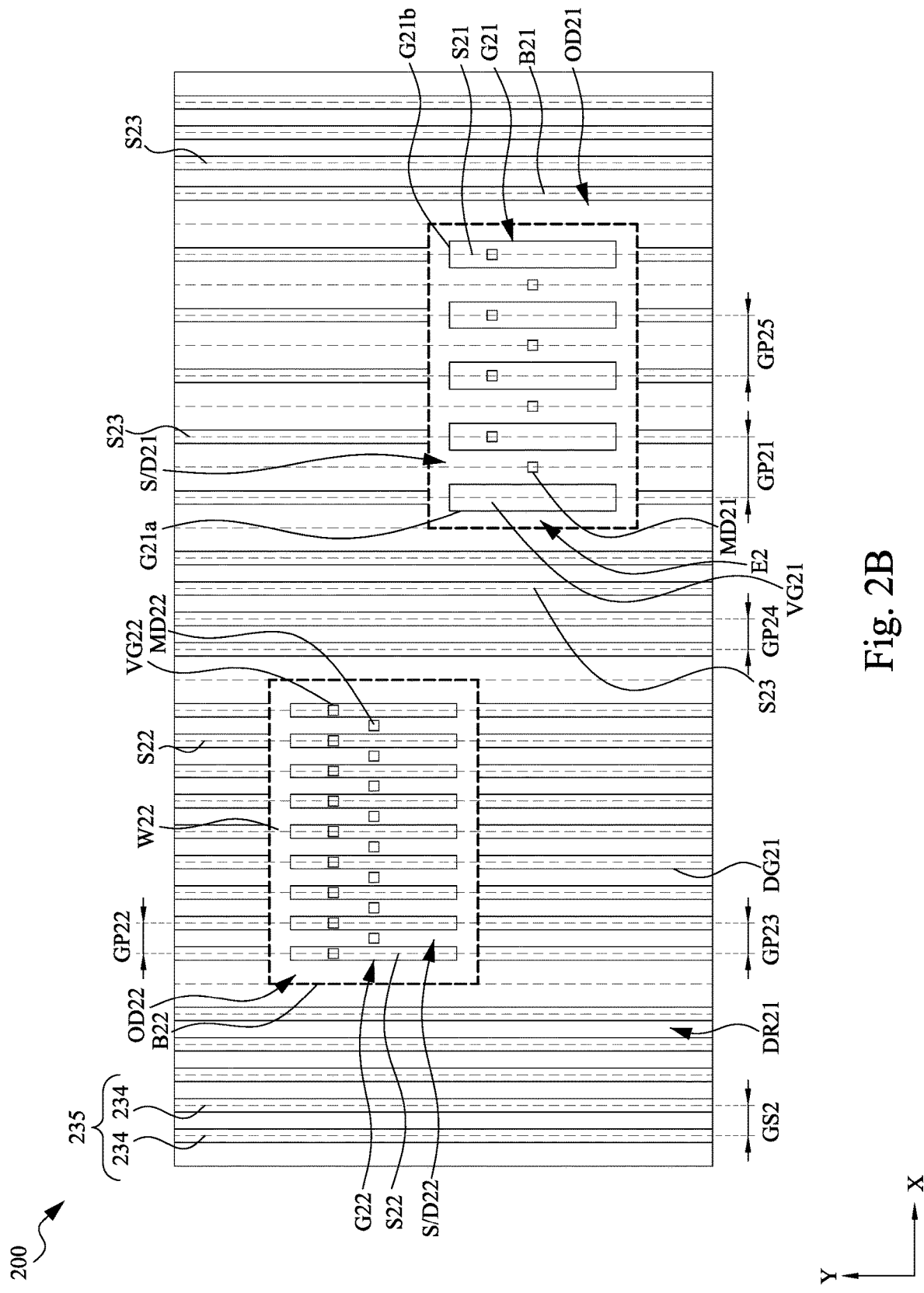

FIG. 2B illustrates a top view of an integrated circuit structure 200 corresponding to design grids in accordance with some embodiments of the present disclosure. It is noted that some elements are not illustrated in FIG. 2B for brevity. The same or similar configurations and/or materials as described with FIG. 2A may be employed in FIG. 2B, and thus are not repeated herein for the sake of clarity. For example, configurations and/or materials related to a design grid 235, grid lines 234, active regions OD21 and OD22, metal gate structures G21 and G22, gate contacts VG21 and VG22, source/drain regions S/D21 and S/D22, source/drain contacts MD21 and MD22, a dummy fill region DR21, non-functional gate structures DG21, grid spacings GS2, longitudinal axes S21-S23, gate pitches GP21-GP25, vertical boundaries B21 and B22, and the PO empty space E2 may be substantially the same as or comparable to those of the design grid 135, the grid lines 134, the active regions OD11 and OD12, the metal gate structures G11 and G12, the gate contacts VG11 and VG12, the source/drain regions S/D11 and S/D12, the source/drain contacts MD11 and MD12, the dummy fill region DR11, the non-functional gate structures DG11, the grid spacing GS1, the longitudinal axes S11-S13, the GP11-GP15, the vertical boundaries B11 and B12, and the PO empty space E1 as shown in FIG. 2A. Therefore, reference may be made to the foregoing paragraphs for the related detailed descriptions, and are not described again herein.

The difference between the present embodiment and the embodiment in FIG. 2A is that a distance between the outermost gate structures G21a and G21b and the non-functional gate structures DG21 are decreased to scale down the PO empty space E2, such that the dummy fill region DR21 can be larger than that shown in FIG. 2A, which in turn allows for improving the pattern density of the non-functional gate structures DG21 on the integrated circuit structure 200 to further prevent pattern loading effect during fabrication processes of the metal gate structures G21 and G22 occurring in a CMP process.

In FIG. 2B, the longitudinal axis S21 of the outermost metal gate structure G21a in the active region OD21 has a distance D21 to the longitudinal axis S23 of the non-functional gate structure DG21, and the longitudinal axis S21 of the outermost metal gate structure G21b in the active region OD21 has a distance D22 to a longitudinal axis S23 of the non-functional gate structure DG21. Because the metal gate structures G21 and G22 in the active region OD21 and the non-functional gate structure DG21 in the dummy fill region DR21 have their longitudinal axes S21, S22, and S23 falling on the vertical grid lines 234, the distance D21 and D22 may be substantially equal to the integer times the grid spacing GS2 or the gate pitch GP22 of the metal gate structures G22, such as about twice of the grid spacing GS2 or the gate pitch GP22 of the metal gate structures G22 as shown in FIG. 2B. On the other hands, the outermost metal gate structure G21a in the active region OD21 has a distance D23 to the non-functional gate structure DG21, the outermost metal gate structure G21b in the active region OD21 has a distance D24 to the non-functional gate structure DG21, and the distances D23 and D24 may be less than about twice of the grid spacing GS2 or the gate pitch GP22.

Figure 2C:
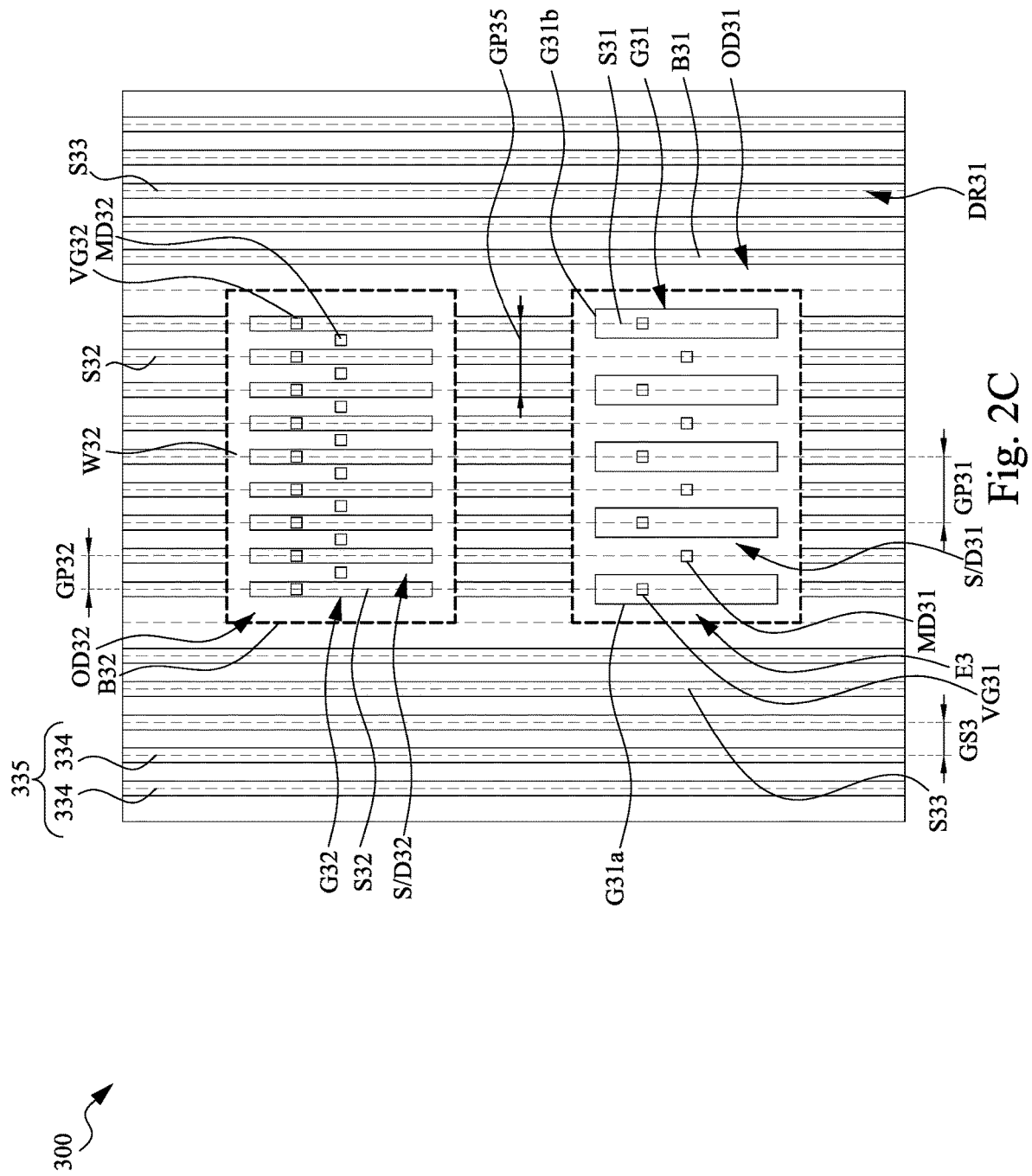

FIG. 2C illustrates a top view of an integrated circuit structure 300 corresponding to design grids in accordance with some embodiments of the present disclosure. It is noted that some elements are not illustrated in FIG. 2C for brevity. The same or similar configurations and/or materials as described with FIG. 2A may be employed in FIG. 2C, and thus are not repeated herein for the sake of clarity. For example, configurations and/or materials related to a design grid 335, grid lines 334, active regions OD31 and OD32, metal gate structures G31 and G32, gate contacts VG31 and VG32, source/drain regions S/D31 and S/D32, source/drain contacts MD31 and MD32, a dummy fill region DR31, non-functional gate structures DG31, grid spacings GS3, longitudinal axes S31-S33, gate pitches GP31, GP32, and GP35, vertical boundaries B31 and B32, and the PO empty space E3 may be substantially the same as or comparable to those of the design grid 135, the grid lines 134, the active regions OD11 and OD12, the metal gate structures G11 and G12, the gate contacts VG11 and VG12, the source/drain regions S/D11 and S/D12, the source/drain contacts MD11 and MD12, the dummy fill region DR11, the non-functional gate structures DG11, the grid spacing GS1, the longitudinal axes S11-S13, the GP11, GP12, and GP15, the vertical boundaries B11 and B12, and the PO empty space E1 as shown in FIG. 2A. Therefore, reference may be made to the foregoing paragraphs for the related detailed descriptions, and are not described again herein.

The difference between the present embodiment and the embodiment in FIG. 2A is that of the non-functional gate structures DG31 located on opposite sides of the active region OD31 along the Y-direction has the gate pitch GP35 less than the gate pitch GP31 of the gate structure G31 in the active region OD31, which in turn allows for improving the pattern density of the non-functional gate structures DG31 on the integrated circuit structure 300 to further prevent pattern loading effect during fabrication processes of the metal gate structures G31 and G32 occurring in a CMP process. In some embodiments, the non-functional gate structures DG31 between the active regions OD31 and OD32 may have the gate pitch GP35 substantially the same as the gate pitch GP32 of the gate structures G32 in the active region OD32 and half of the gate pitch GP31 of the gate structures G31 in the active region OD31.

In FIG. 2C, longitudinal axes of the metal gate structures G31 are respectively aligned with longitudinal axes of the metal gate structures G32 in the Y-direction. In this configuration, the metal gate structures G31 and G32 and the corresponding non-functional gate structures DG31 can be formed by using a gate cut process. By way of example and not limitation, fabrication of the metal gate structures G31 and G32 and the non-functional gate structures DG31 may include forming as a single continuous HKMG strip extending along the Y-direction from top view, followed by etching the single continuous HKMG strip to break it into separate strips that respectively serve as the metal gate structures G31 and G32 and the non-functional gate structures DG31.

Figure 3A:
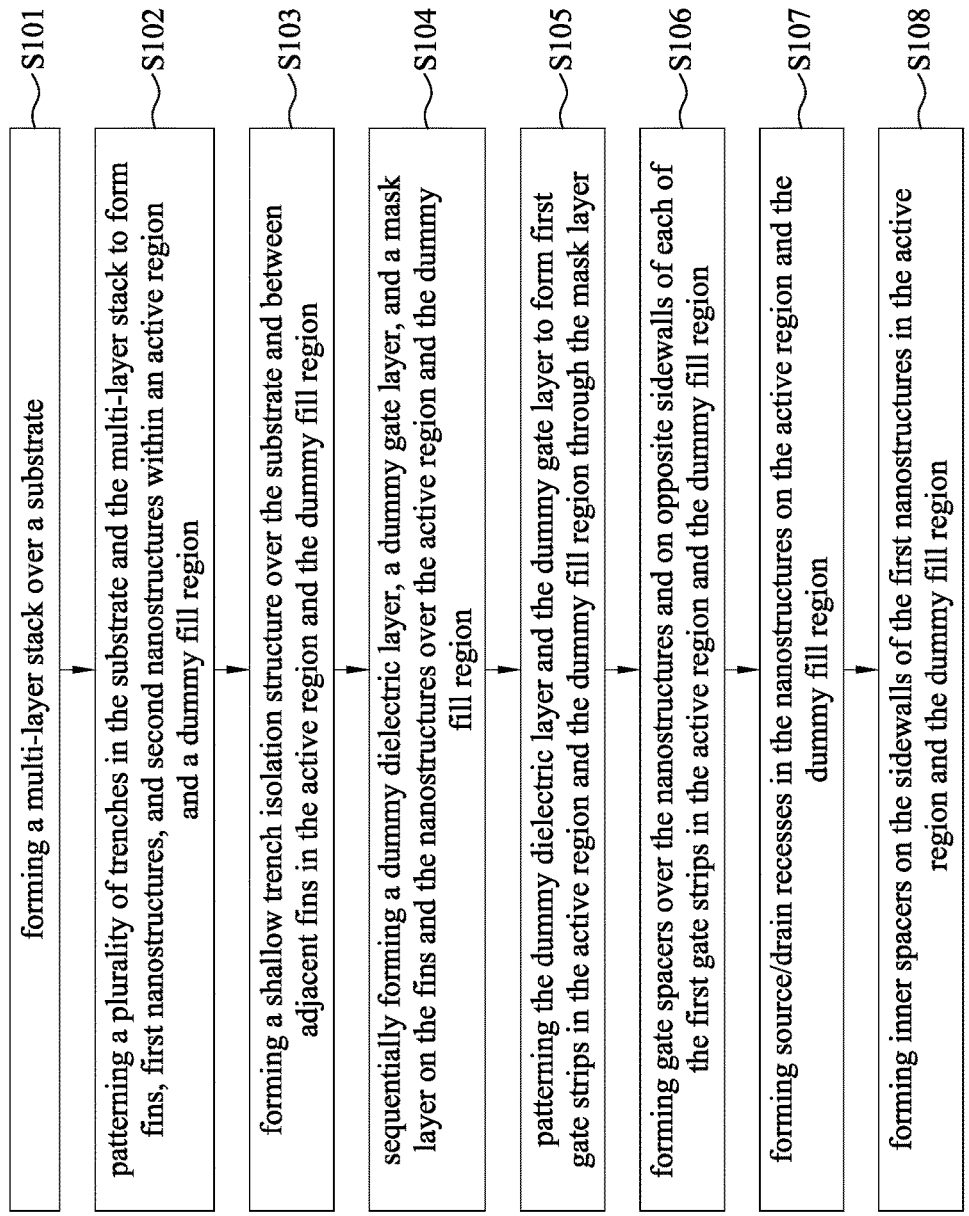
FIGS. 3A and 3B are a method M of manufacturing an integrated circuit structure in accordance with some embodiments of the present disclosure.
Figure 3B:
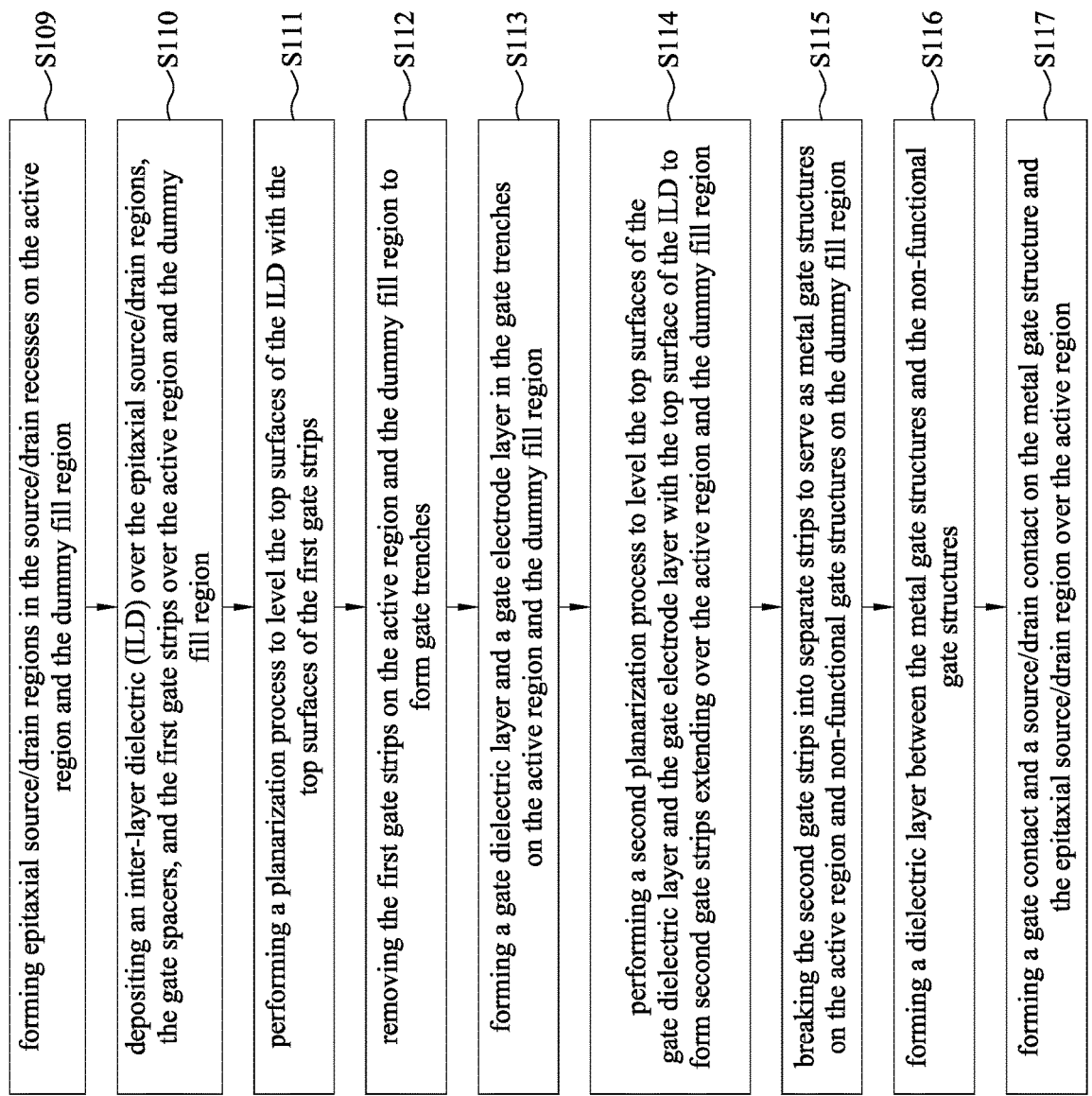

Referring now to FIGS. 3A and 3B, illustrated is a flowchart of an exemplary method M for fabrication of an integrated circuit structure in accordance with some embodiments. The method M includes a relevant part of the entire manufacturing process. It is understood that additional operations may be provided before, during, and after the operations shown by FIGS. 3A and 3B, and some of the operations described below can be replaced or eliminated for additional embodiments of the method. The order of the operations/processes may be interchangeable. The method M includes fabrication of the integrated circuit structure 100. However, the fabrication of the integrated circuit structure 100 is merely an example for describing the manufacturing process according to some embodiments of the present disclosure.

Figure 14:
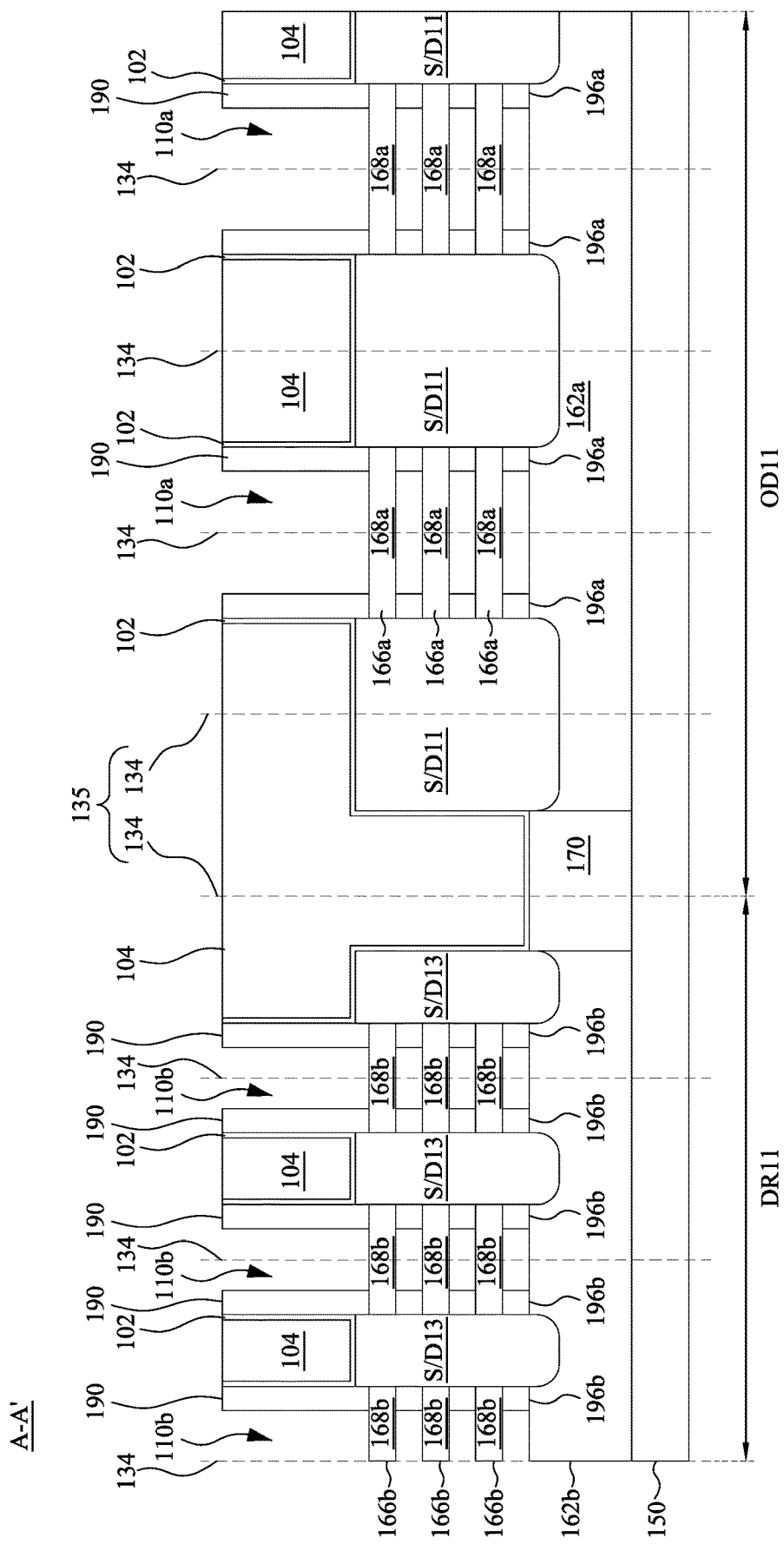
Figure 15:
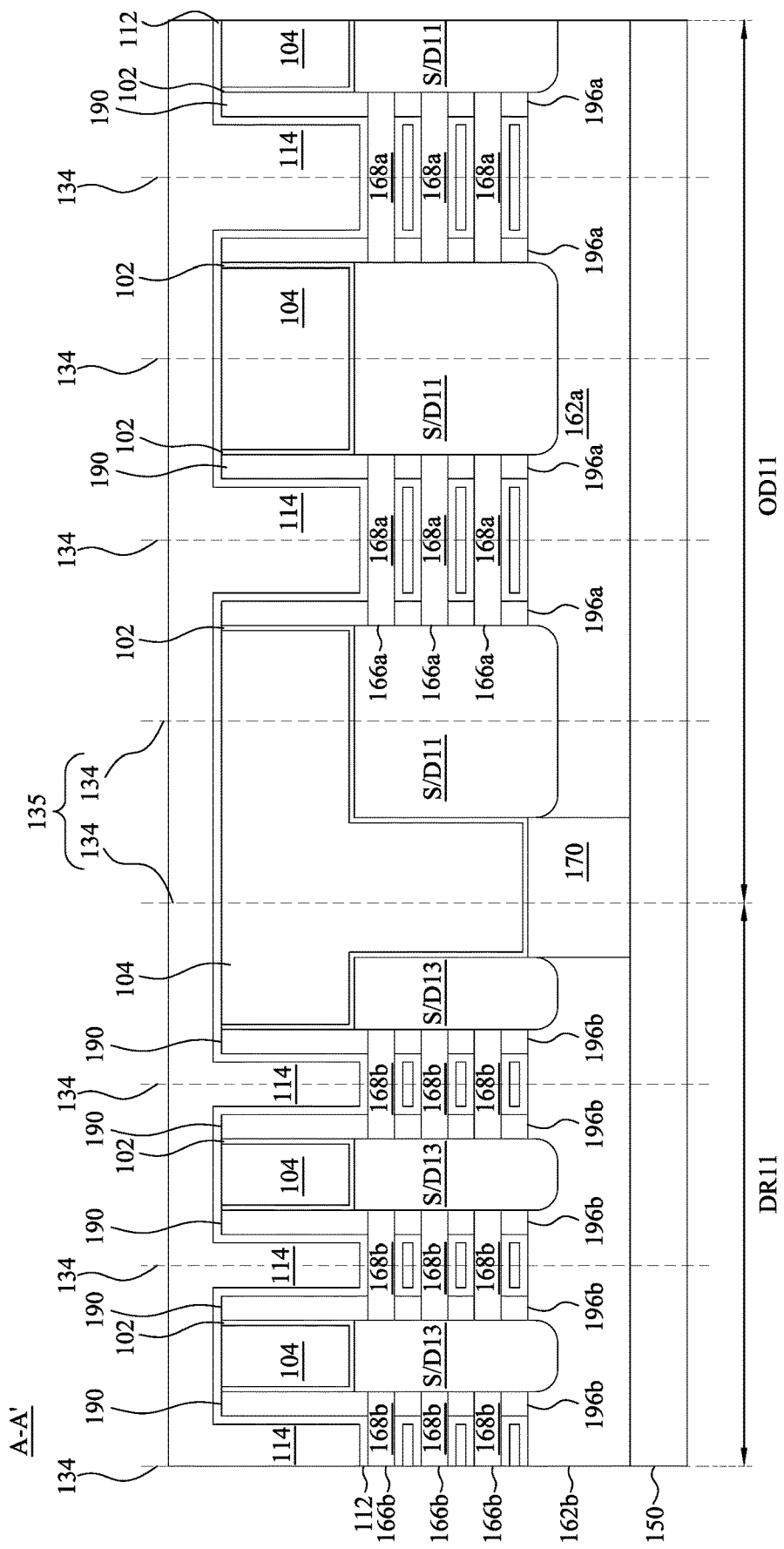
Figure 16A:
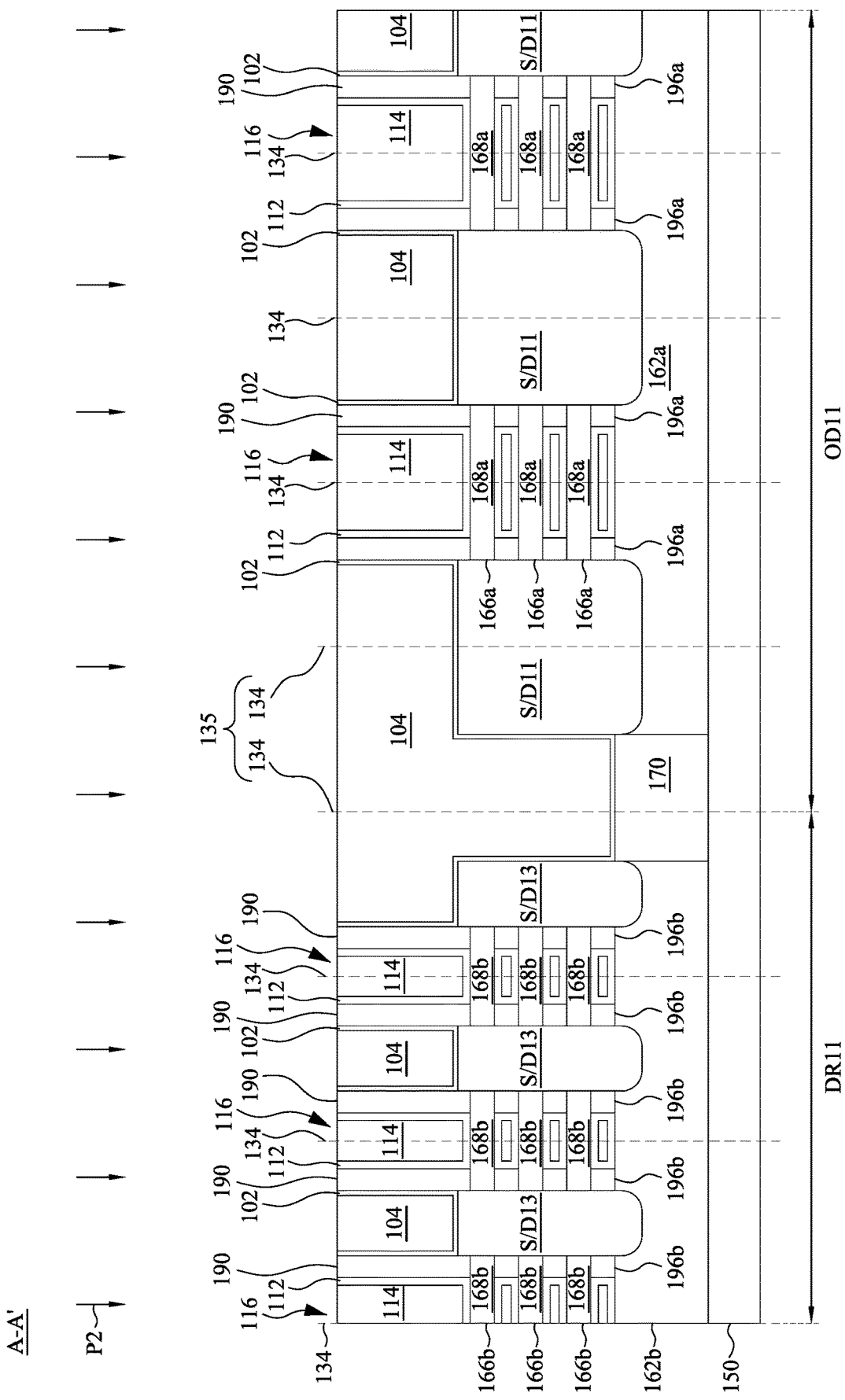
Figure 16B:
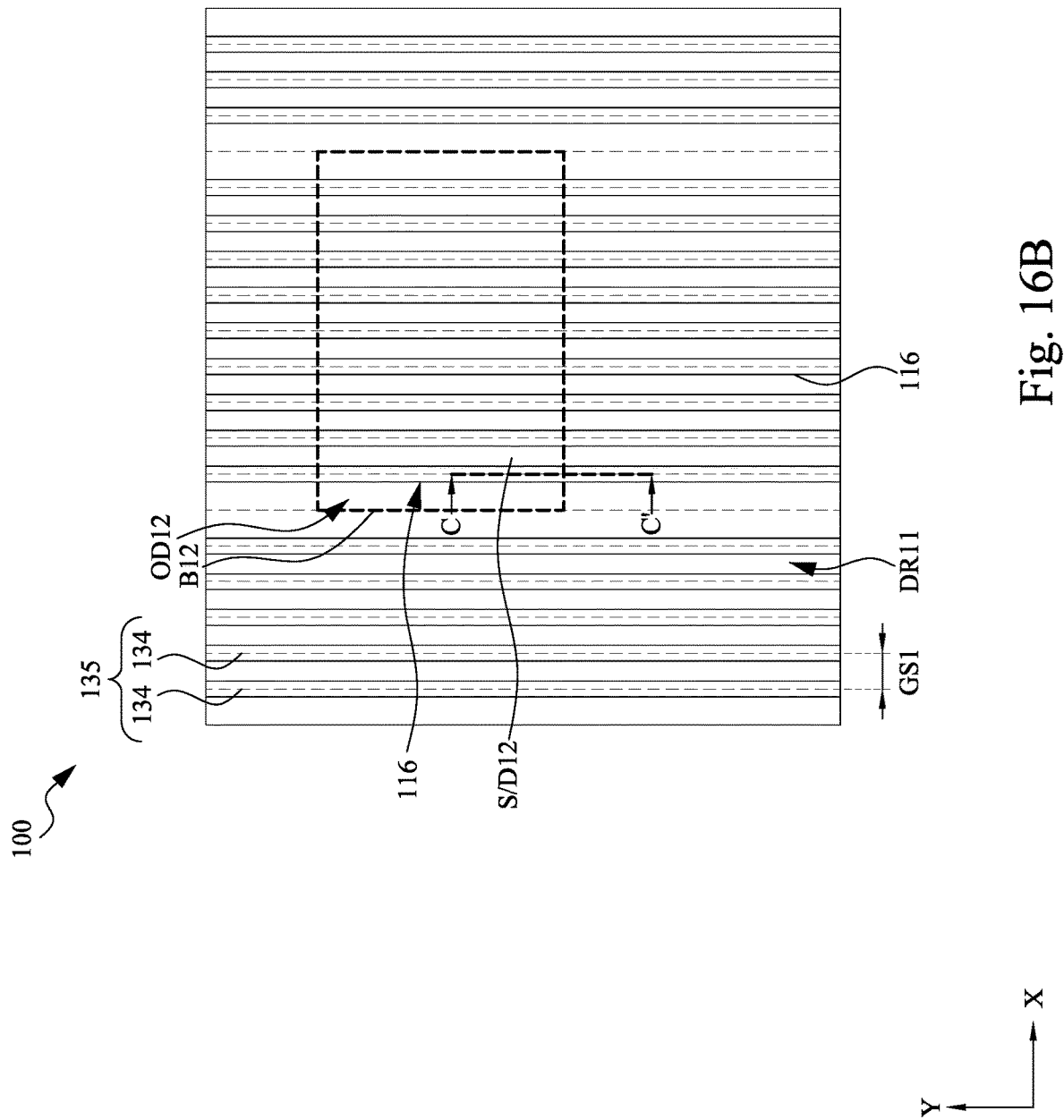
Figure 16C:
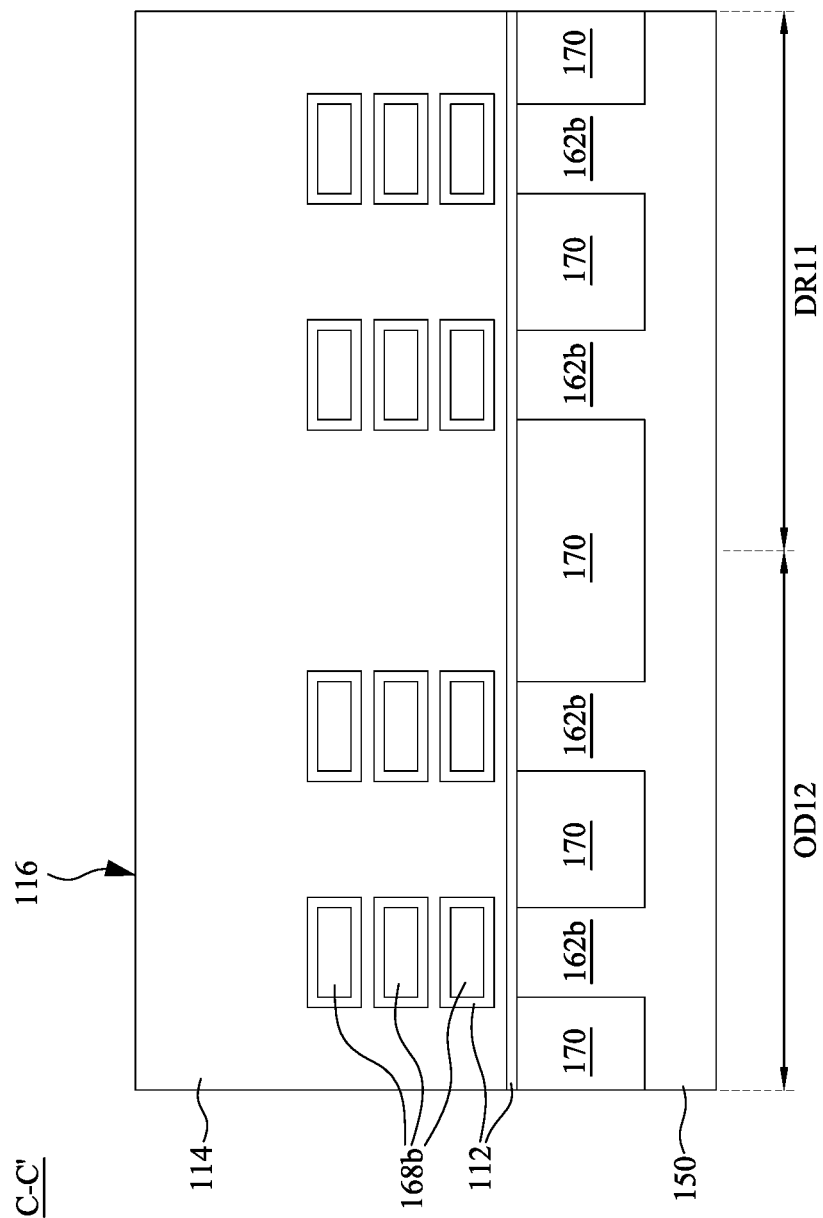
Figure 17A:
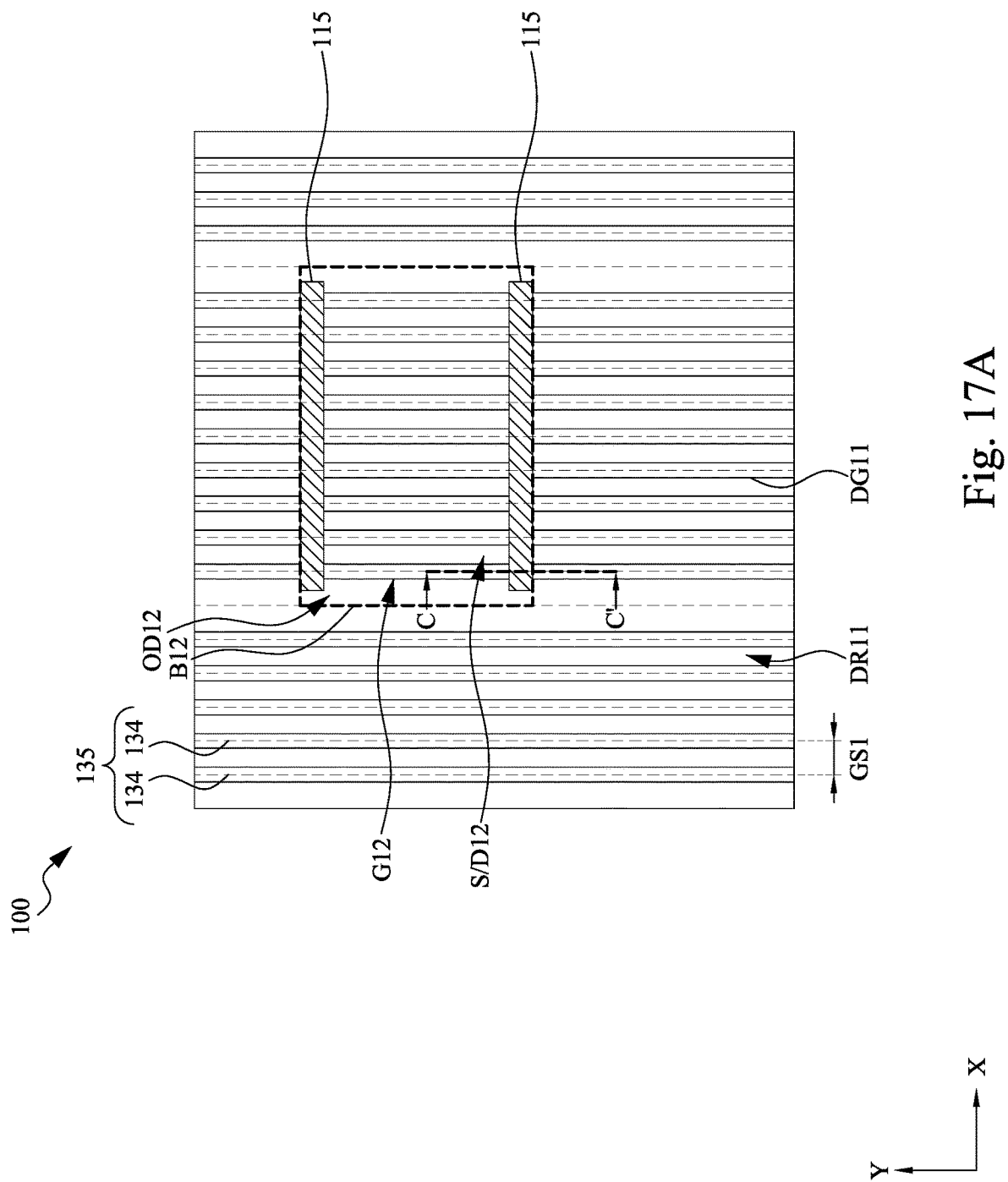
Figure 17B:
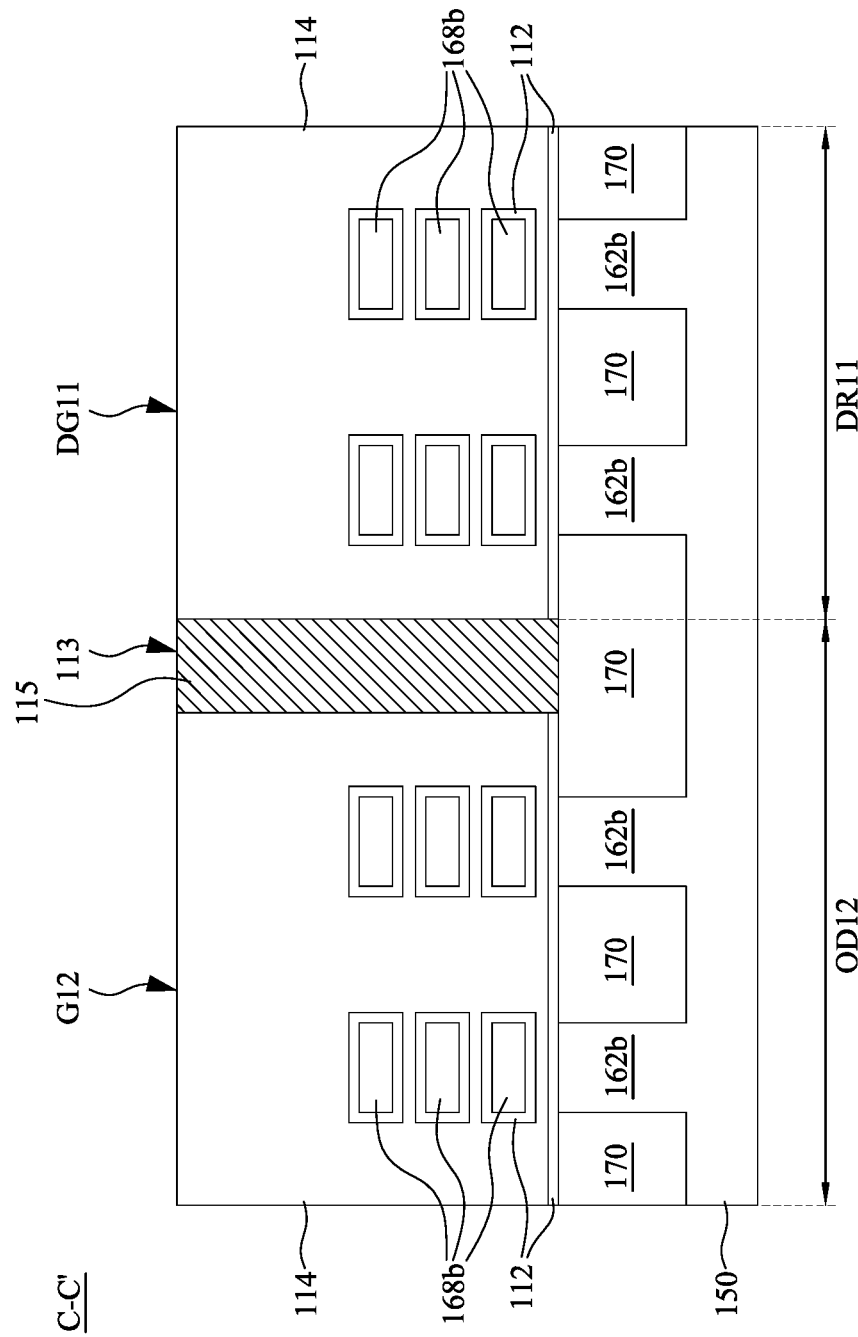

FIGS. 4-18 illustrate the method M in various stages of forming the integrated circuit structure 100 in accordance with some embodiments of the present disclosure. FIGS. 4-7 and 8A are perspective views of the integrated circuit structure 100, and FIGS. 8B, 9-16A, and 18 are cross-section views taken along line A-A' illustrated in FIG. 8A. FIGS. 16B and 17A are top views of integrated circuit structure 100 including the active region OD12 and the dummy fill region DR11 illustrated in FIG. 2A, and FIGS. 16C and 17B are cross-section views taken along line C-C' illustrated in FIGS. 16B and 17A. Line A-A' is along a longitudinal axis of fin 62 as shown in FIG. 1 and in a direction of, for example, a current flow between the epitaxial source/drain regions 98 of the nano-FET as shown in FIG. 1.

Figure 4:
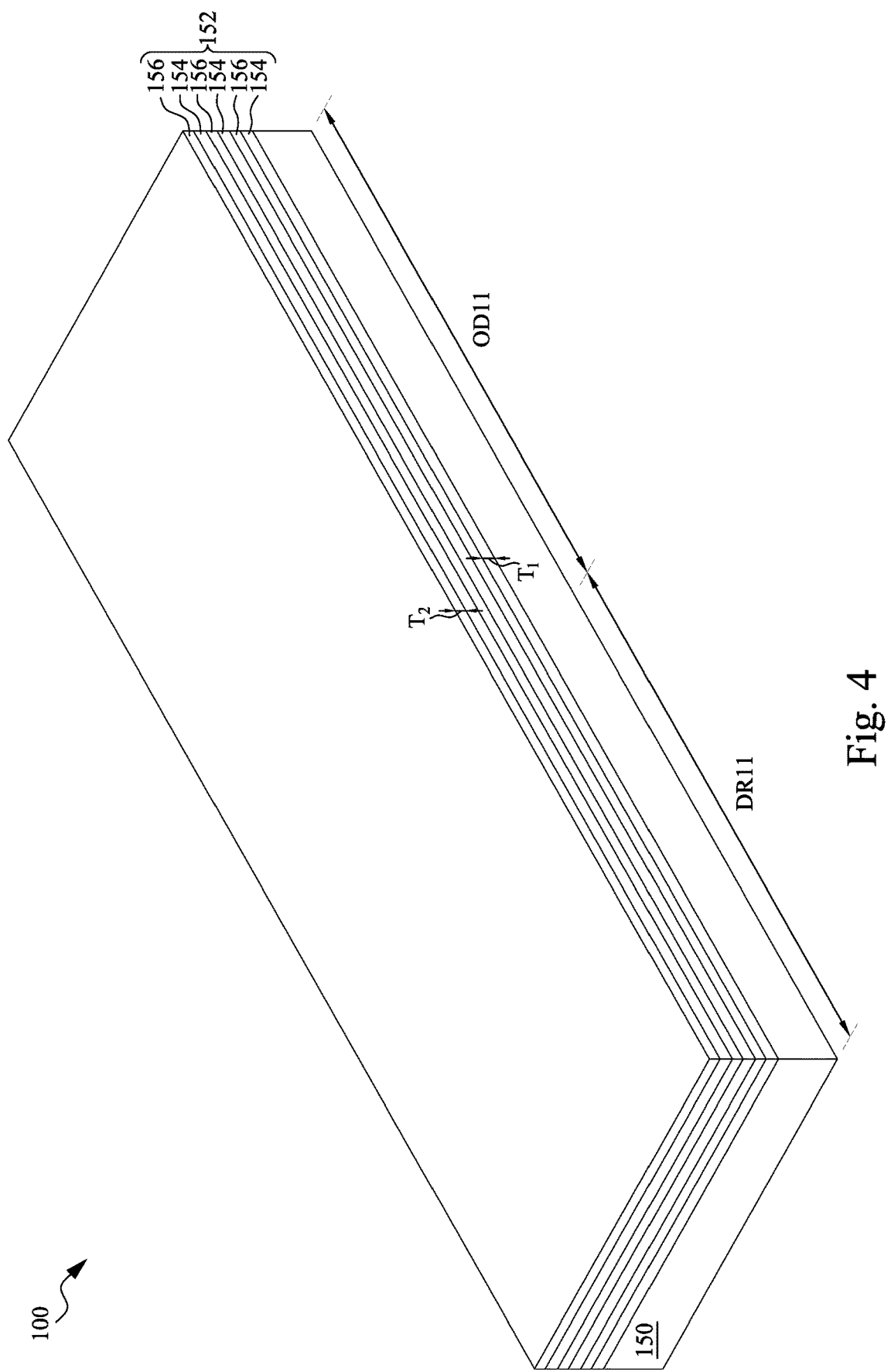
FIGS. 4 to 18 illustrate schematic views of an integrated circuit structure corresponding to design grids in accordance with some embodiments of the present disclosure.

The method M begins at block S101 where a multi-layer stack is formed over a substrate. Referring to FIG. 4, in some embodiments of block S101, a substrate 150 is provided for forming nano-FETs. The substrate 150 may be a semiconductor substrate, such as a bulk semiconductor, a semiconductor-on-insulator (SOI) substrate, or the like, which may be doped (e.g., with a p-type or an n-type impurity) or undoped. The substrate 150 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 150 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 150 has an active region OD11 and a dummy fill region DR11. The active region OD11 will form transistors therein as a variety of active devices, such as P-channel field effect transistors (PFETs), N-channel field effect transistors (NFETs), metal-oxide semiconductor field effect transistors (MOSFETs), complementary metal-oxide semiconductor transistors (CMOSs), bipolar transistors, high voltage transistors, high frequency transistors, and/or combinations thereof. The dummy fill region DR11 will form non-functional gate structures therein that may aid in preventing pattern loading effect during fabrication processes of metal gate structures in the active region OD11 (e.g. loading effect (e.g., dishing) occurring in a CMP process used to remove excessive gate metal materials in the active region). In some embodiments, the dummy fill region DR11 may include a variety of passive devices, such as capacitors and other passive devices such as resistors, inductors, fuses, or other suitable passive devices.

The substrate 150 may be lightly doped with a p-type or an n-type impurity. An anti-punch-through (APT) implantation may be performed on an upper portion of the substrate 150 to form an APT region. During the APT implantation, impurities may be implanted in the substrate 150. The APT region may extend under the source/drain regions in the nano-FETs. The APT region may be used to reduce the leakage from the source/drain regions to the substrate 150. In some embodiments, the doping concentration in the APT region may be in the range of $10^{18}$ cm$^{-3}$ to $10^{19}$ cm$^{-3}$.

A multi-layer stack 152 is formed over the substrate 150. The multi-layer stack 152 includes alternating first semiconductor layers 54 and second semiconductor layers 156. The first semiconductor layers 154 are formed of a first semiconductor material, and the second semiconductor layers 156 are formed of a second semiconductor material. The semiconductor materials may each be selected from the candidate semiconductor materials of the substrate 150. In the illustrated embodiment, the multi-layer stack 152 includes three layers of each of the first semiconductor layers 154 and the second semiconductor layers 156. It should be appreciated that the multi-layer stack 152 may include any number of the first semiconductor layers 154 and the second semiconductor layers 156.

In the illustrated embodiment, and as will be subsequently described in greater detail, the first semiconductor layers 154 will be removed and the second semiconductor layers 156 will patterned to form channel regions for the nano-FETs in the active region OD11 and non-functional transistors in the dummy fill region DR11. The first semiconductor layers 154 are sacrificial layers (or dummy layers), which will be removed in subsequent processing to expose the top surfaces and the bottom surfaces of the second semiconductor layers 156. The first semiconductor material of the first semiconductor layers 154 is a material that has a high etching selectivity from the etching of the second semiconductor layers 156, such as silicon germanium. The second semiconductor material of the second semiconductor layers 156 is a material suitable for both n-type and p-type devices, such as silicon.

In some embodiments, the first semiconductor material of the first semiconductor layers 154 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 156 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 154 may be removed without removing the second semiconductor layers 156 in the n-type region, and the second semiconductor layers 156 may be removed without removing the first semiconductor layers 54 in the p-type region.

Each of the layers of the multi-layer stack 152 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in a range of 5 nm to 30 nm. In some embodiments, some layers (e.g., the second semiconductor layers 156) are formed to be thinner than other layers (e.g., the first semiconductor layers 154). For example, in embodiments in which the first semiconductor layers 154 are sacrificial layers (or dummy layers) and the second semiconductor layers 156 are patterned to form channel regions for the nano-FETs in the active region OD11 and non-functional transistors in the dummy fill region DR11, the first semiconductor layers 154 can have a first thickness $T_1$ and the second semiconductor layers 156 can have a second thickness $T_2$, with the second thickness $T_2$ being from 30% to 60% less than the first thickness $T_1$. Forming the second semiconductor layers 156 to a smaller thickness allows the channel regions to be formed at a greater density.

Figure 5:
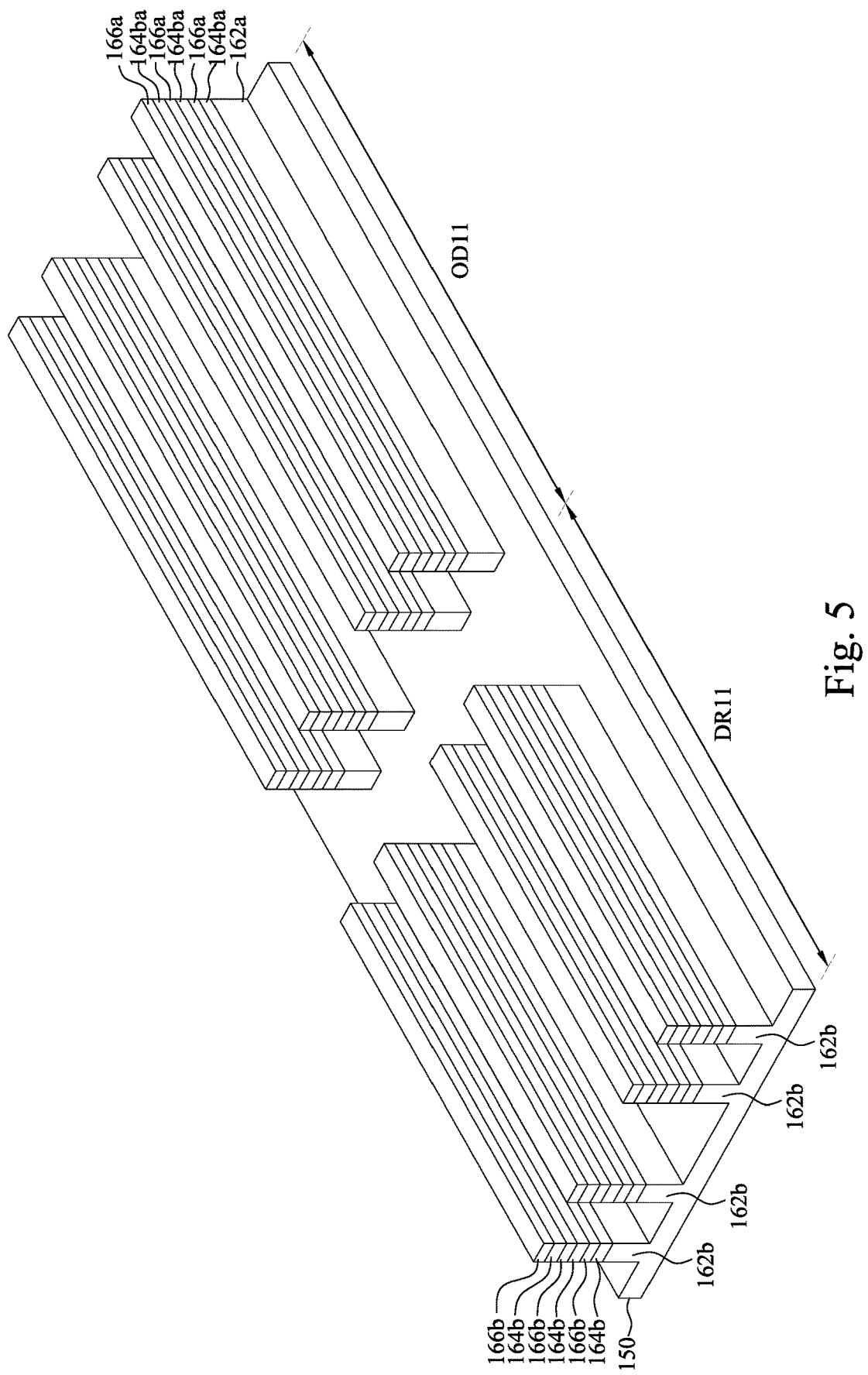

Referring back to FIG. 3A, the method M then proceeds to block S102 where a plurality of trenches are patterned in the substrate and the multi-layer stack to form fins, first nanostructures, and second nanostructures within an active region and a dummy fill region. reference to FIG. 5, in some embodiments of block S102, trenches are patterned in the substrate 150 and the multi-layer stack 152 to form fins 162a, first nanostructures 164a, and second nanostructures 166a in the active region OD11 and form fins 162b, first nanostructures 164b, and second nanostructures 166b in the dummy fill region DR11. The fins 162a and 162b are semiconductor strips patterned in the substrate 150 within the active region OD11 and the dummy fill region DR11. The first nanostructures 164a and 164b and the second nanostructures 166a and 166b include the remaining portions of the first semiconductor layers 154 and the second semiconductor layers 156, respectively. The trenches may be patterned by any acceptable etch process, such as a reactive ion etch (RIE), neutral beam etch (NBE), the like, or a combination thereof. The etching may be anisotropic.

The fins 162a and 162b and the nanostructures 164a, 164b, 166a, and 166b may be patterned by any suitable method. For example, the fins 162a and 162b and the nanostructures 164a, 164b, 166a, and 166b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 162a and 162b and the nanostructures 164a, 164b, 166a, and 166b. In some embodiments, the mask (or other layer) may remain on the nanostructures 164a, 164b, 166a, and 166b.

The fins 162a and 162b and the nanostructures 164a, 164b, 166a, and 166b may each have widths in a range of about 8 nm to about 40 nm. In the illustrated embodiment, the fins 162a and 162b and the nanostructures 164a, 164b, 166a, and 166b have substantially equal widths in the active region OD11 and the dummy fill region DR11. In another embodiment, the fins 162a and the nanostructures 164a and 166a in one region (e.g., the active region OD11) are wider or narrower than the fins 162b and the nanostructures 164b and 166b in another region (e.g., the dummy fill region DR11).

Figure 6:
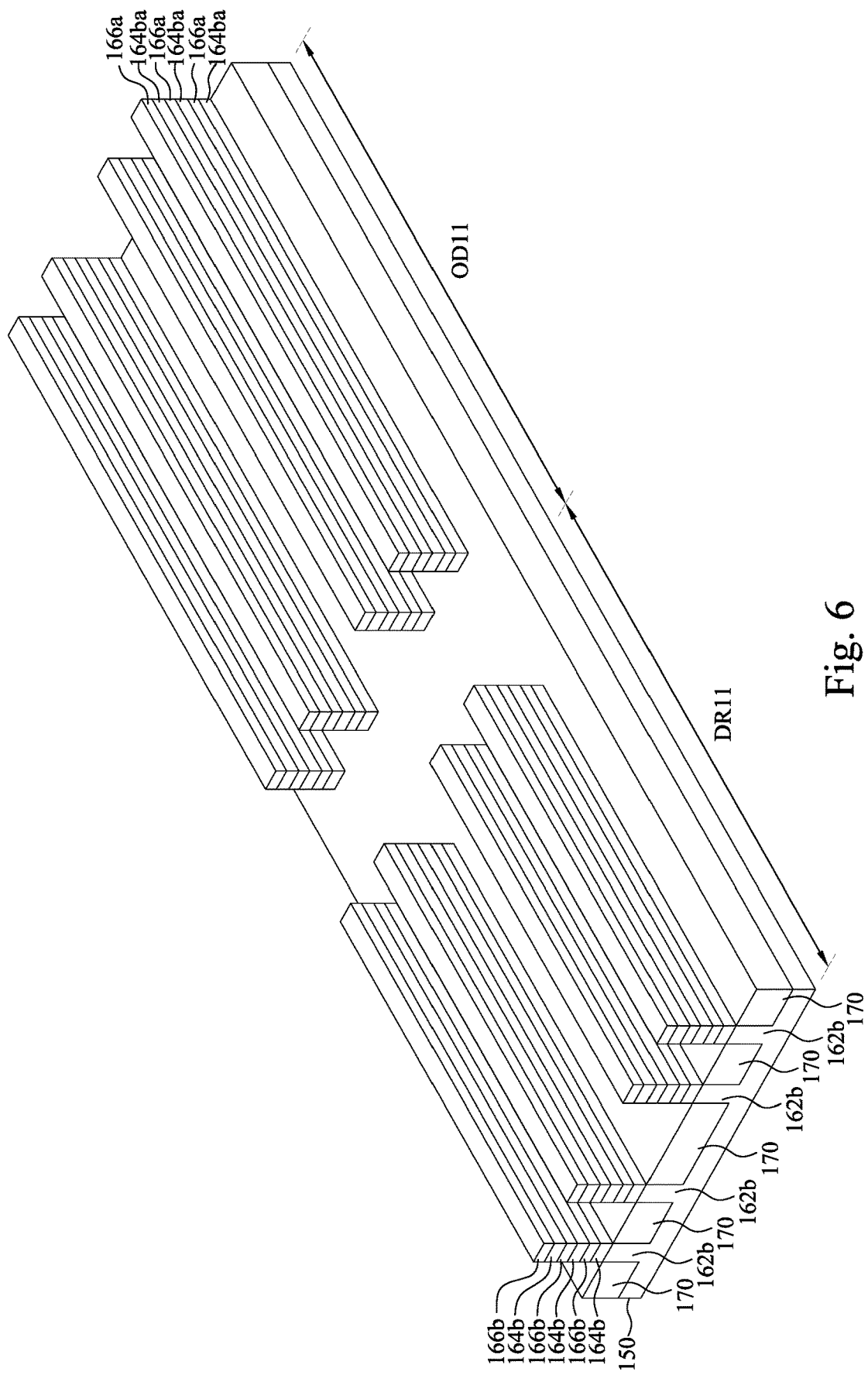

Referring back to FIG. 3A, the method M then proceeds to block S103 where a shallow trench isolation structure is formed over the substrate and between adjacent fins in the active region and the dummy fill region. With reference to FIG. 6, in some embodiments of block S103, a shallow trench isolation (STI) structure 170 is formed over the substrate 150 and between adjacent fins 162a and 162b within the active region OD11 and the dummy fill region DR11. The STI structure 170 is disposed around at least a portion of the fins 162a and 162b such that at least a portion of the nanostructures 164a, 164b, 166a, and 166b protrude from between adjacent STI structure 170. In the illustrated embodiment, the top surface of the STI structure 170 is coplanar (within process variations) with the top surfaces of the fins 162a and 162b. In some embodiments, the top surface of the STI structure 170 is above or below the top surfaces of the fins 162a and 162b. The STI structure 170 separates the features of adjacent devices.

The STI structure 170 may be formed by any suitable method. For example, an insulation material can be formed over the substrate 150 and the nanostructures 164a, 164b, 166a, and 166b, and between adjacent fins 162a and 162b. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable CVD (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 164a, 164b, 166a, and 166b. Although the STI structure 170 is each illustrated as a single layer, some embodiments may utilize multiple layers. For example, in some embodiments a liner (not separately illustrated) may first be formed along surfaces of the substrate 150, the fins 162a and 162b, and the nanostructures 164a, 164b, 166a, and 166b. Thereafter, a fill material, such as those previously described may be formed over the liner.

A removal process is then applied to the insulation material to remove excess insulation material over the nanostructures 164a, 164b, 166a, and 166b within the active region OD11 and the dummy fill region DR11. In some embodiments, a planarization process such as a chemical mechanical polish (CMP) or the like may be utilized. The planarization process exposes the nanostructures 164a, 164b, 166a, and 166b such that top surfaces of the nanostructures 164a, 164b, 166a, and 166b and the insulation material are coplanar (within process variations) after the planarization process is complete. In embodiments in which a mask remains on the nanostructures 164a, and 164b, 166a, 166b, the planarization process may expose the mask or remove the mask such that top surfaces of the mask or the nanostructures 164a, 164b, 166a, and 166b, respectively, and the insulation material are coplanar (within process variations) after the planarization process is complete. The insulation material is then recessed to form the STI structure 170. The insulation material is recessed such that at least a portion of the nanostructures 164a, 164b, 166a, and 166b protrude from between adjacent portions of the insulation material. Further, the top surface of the STI structure 170 may have a flat surface as illustrated, a convex surface, a concave surface (such as dishing), or a combination thereof. The top surface of the STI structure 170 may be formed flat, convex, and/or concave by an appropriate etch. The insulation material may be recessed using any acceptable etching process, such as one that is selective to the material of the insulation material (e.g., selectively etches the insulation material of the STI structure 170 at a faster rate than the materials of the fins 162a and 162b and the nanostructures 164a, 164b, 166a, and 166b). For example, an oxide removal may be performed using dilute hydrofluoric (dHF) acid.

The process previously described is just one example of how the fins 162a and 162b and the nanostructures 164a, 164b, 166a, and 166b may be formed within the active region OD11 and the dummy fill region DR11. In some embodiments, the fins 162a and 162b and/or the nanostructures 164a, 164b, 166a, and 166b may be formed using a mask and an epitaxial growth process. For example, a dielectric layer can be formed over a top surface of the substrate 150, and trenches can be etched through the dielectric layer to expose the underlying substrate 150. Epitaxial structures can be epitaxially grown in the trenches, and the dielectric layer can be recessed such that the epitaxial structures protrude from the dielectric layer to form the fins 162a and 162b and/or the nanostructures 164a, 164b, 166a, and 166b. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together. Further, appropriate wells (not separately illustrated) may be formed in the substrate 150, the fins 162a and 162b, and/or the nanostructures 164a, 164b, 166a, and 166b. The wells within the active region OD may have a conductivity type opposite from a conductivity type of source/drain regions that will be subsequently formed in each of the n-type region and the p-type region. In some embodiments, a p-type well is formed in the n-type region within the active region OD11, and an n-type well is formed in the p-type region within the active region OD11. In some embodiments, a p-type well or an n-type well is formed in both the n-type region and the p-type region.

In embodiments with different well types, different implant steps for the n-type region and the p-type region within the active region OD11 may be achieved using mask (not separately illustrated) such as a photoresist. For example, a photoresist may be formed over the fins 162a and 162b, the nanostructures 164a, 164b, 166a, and 166b, and the STI structure 170 in the n-type region within the active region OD11. The photoresist is patterned to expose the p-type region within the active region OD11. The photoresist can be formed by using a spin-on technique and can be patterned using acceptable photolithography techniques. Once the photoresist is patterned, an n-type impurity implant is performed in the p-type region within the active region OD11, and the photoresist may act as a mask to substantially prevent n-type impurities from being implanted into the n-type region within the active region OD11. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region within the active region OD11, a mask (not separately illustrated) such as a photoresist is formed over the fins 162a and 162b, the nanostructures 164a, 164b, 166a, and 166b, and the STI structure 170 in the p-type region within the active region OD11. The photoresist is patterned to expose the n-type region within the active region OD11. The photoresist can be formed by using a spin-on technique and can be patterned using acceptable photolithography techniques. Once the photoresist is patterned, a p-type impurity implant may be performed in the n-type region within the active region OD11, and the photoresist may act as a mask to substantially prevent p-type impurities from being implanted into the p-type region within the active region OD11. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region and the p-type region within the active region OD11, an anneal may be performed to repair implant damage and to activate the p-type and/or n-type impurities that were implanted. In some embodiments where epitaxial structures are epitaxially grown for the fins 162a and 162b and/or the nanostructures 164a, 164b, 166a, and 166b, the grown materials may be in situ doped during growth, which may obviate the implantations, although in situ and implantation doping may be used together.

Figure 7:
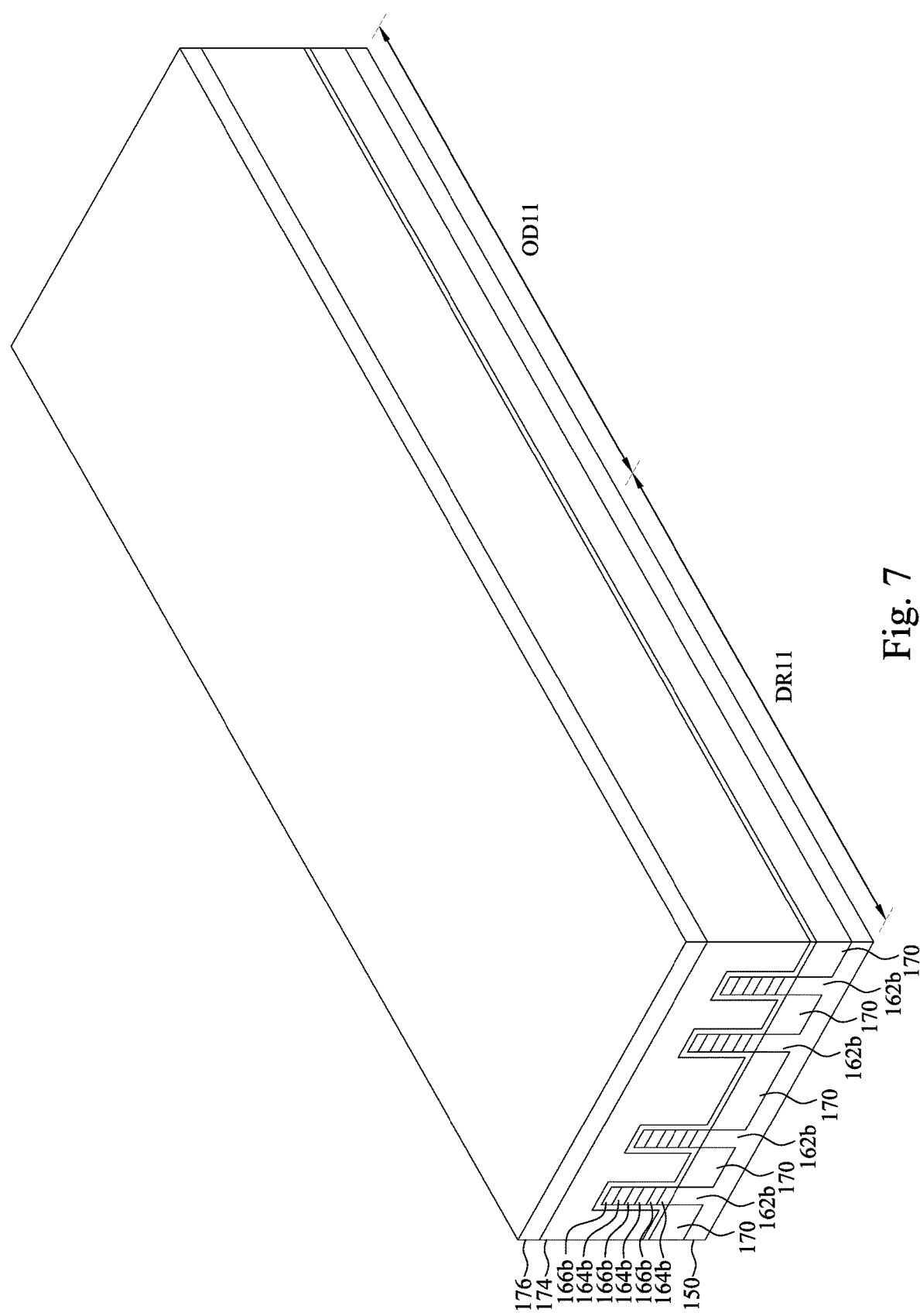

Referring back to FIG. 3A, the method M then proceeds to block S104 where a dummy dielectric layer, a dummy gate layer, and a mask layer are sequentially formed on the fins and the nanostructures over the active region and the dummy fill region. With reference to FIG. 7, in some embodiments of block S104, a dummy dielectric layer 172 is formed on the fins 162a and 162b and the nanostructures 164a, 164b, 166a, and 166b over the active region OD11 and the dummy fill region DR11. The dummy dielectric layer 172 may be formed of a dielectric material such as silicon oxide, silicon nitride, a combination thereof; or the like, which may be deposited or thermally grown according to acceptable techniques. A dummy gate layer 174 is formed over the dummy dielectric layer 172, and a mask layer 176 is formed over the dummy gate layer 174. The dummy gate layer 174 may be deposited over the dummy dielectric layer 172 and then planarized, such as by a CMP. The mask layer 176 may be deposited over the dummy gate layer 174. The dummy gate layer 174 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 174 may be formed of material(s) that have a high etching selectivity from the etching of insulation materials, e.g., the STI structure 170 and/or the dummy dielectric layer 172. The mask layer 176 may be formed of a dielectric material such as silicon nitride, silicon oxynitride, or the like. In this example, a single dummy gate layer 174 and a single mask layer 176 are formed across the active region OD11 and the dummy fill region DR11. In the illustrated embodiment, the dummy dielectric layer 172 covers the fins 162a and 162b, the nanostructures 164a, 164b, 166a, and 166b, and the STI structure 170, such that the dummy dielectric layer 172 extends over the STI structure 170 and between the dummy gate layer 174 and the STI structure 170. In another embodiment, the dummy dielectric layer 172 covers only the fins 162a and 162b and the nanostructures 164a, 164b, 166a, and 166b.

Figure 8A:
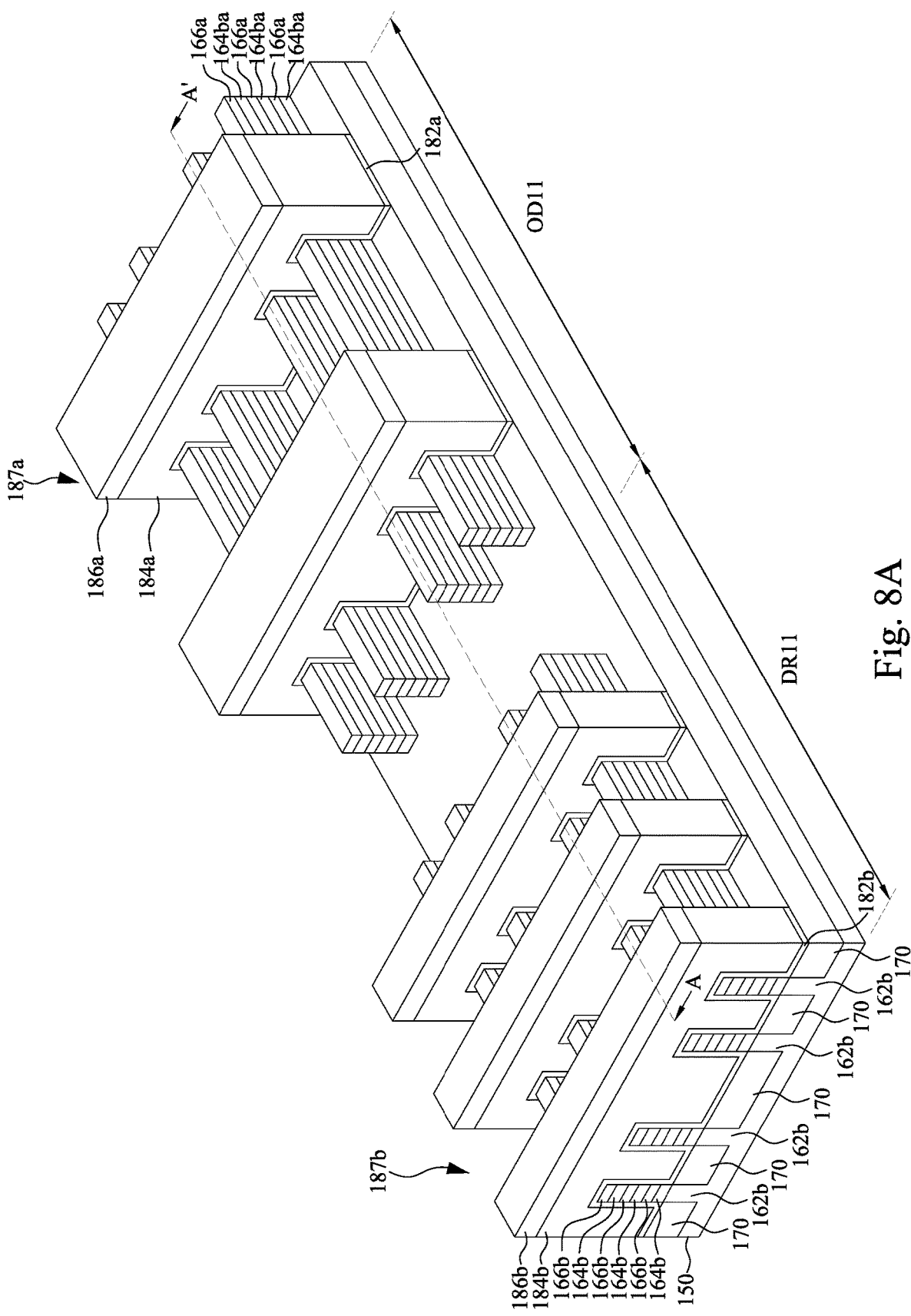
Figure 8B:
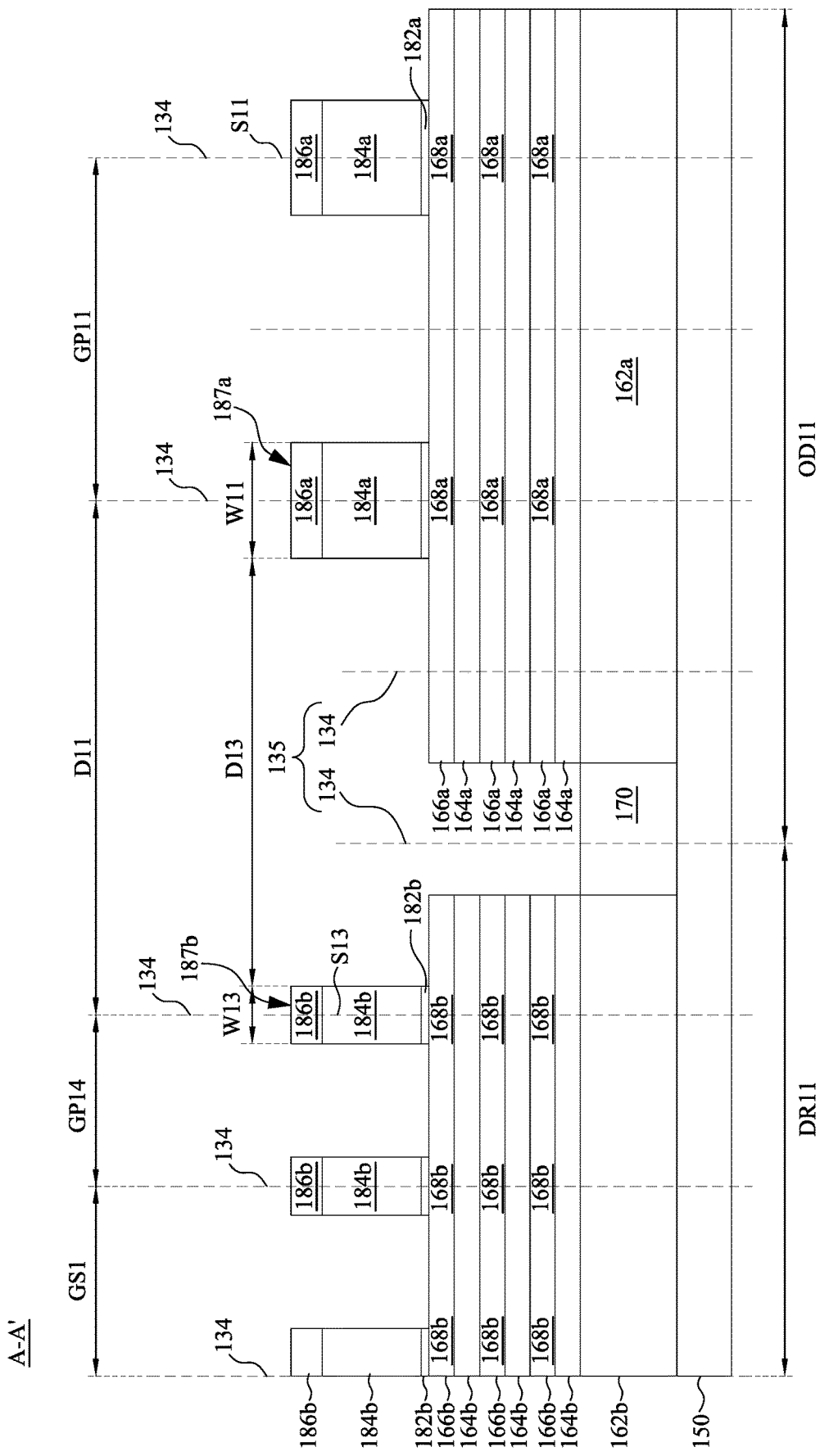

Referring back to FIG. 3A, the method M then proceeds to block S105 where the dummy dielectric layer and the dummy gate layer are patterned to form first gate strips in the active region and the dummy fill region through the mask layer. With reference to FIGS. 8A and 8B, in some embodiments of block S105, the mask layer 176 is patterned using acceptable photolithography and etching techniques to form masks 186a in the active region OD11 and the masks 186b in the dummy fill region DR11. The pattern of the masks 186a and 186b are then transferred to the dummy gate layer 174 by any acceptable etching technique to form dummy gates 184a in the active region OD11 and non-functional gates 184b in the dummy fill region DR11. The pattern of the masks 186a and 186b may optionally be further transferred to the dummy dielectric layer 172 by any acceptable etching technique to form dummy dielectrics 182a in the active region OD11 and dummy dielectrics 182b in the dummy fill region DR11. The dummy dielectric 182a and the dummy gate 184a in the active region OD11 can be collectively referred to as a gate strip 187a, and the dummy dielectric 182b and the non-functional gate 184b in the dummy fill region DR11 can be collectively referred to as a gate strip 187b. The gate strips 187a and 187b cover portions of the nanostructures 164a, 164b, 166a, 166b that will be exposed in subsequent processing to form channel regions. Specifically, the dummy gates 184a and the non-functional gates 184b extend along the portions of the nanostructures 166a and 166b that will be patterned to form channel regions 168a and 168b (see FIG. 9). The pattern of the masks 186a and 186b may be used to physically separate adjacent dummy gates 184a and the non-functional gates 184b. The dummy gates 184a and the non-functional gates 184b may also have lengthwise directions substantially perpendicular (within process variations) to the lengthwise directions of the fins 162a and 162b. The masks 186a and 186b can optionally be removed after patterning, such as by any acceptable etching technique.

Figure 9:
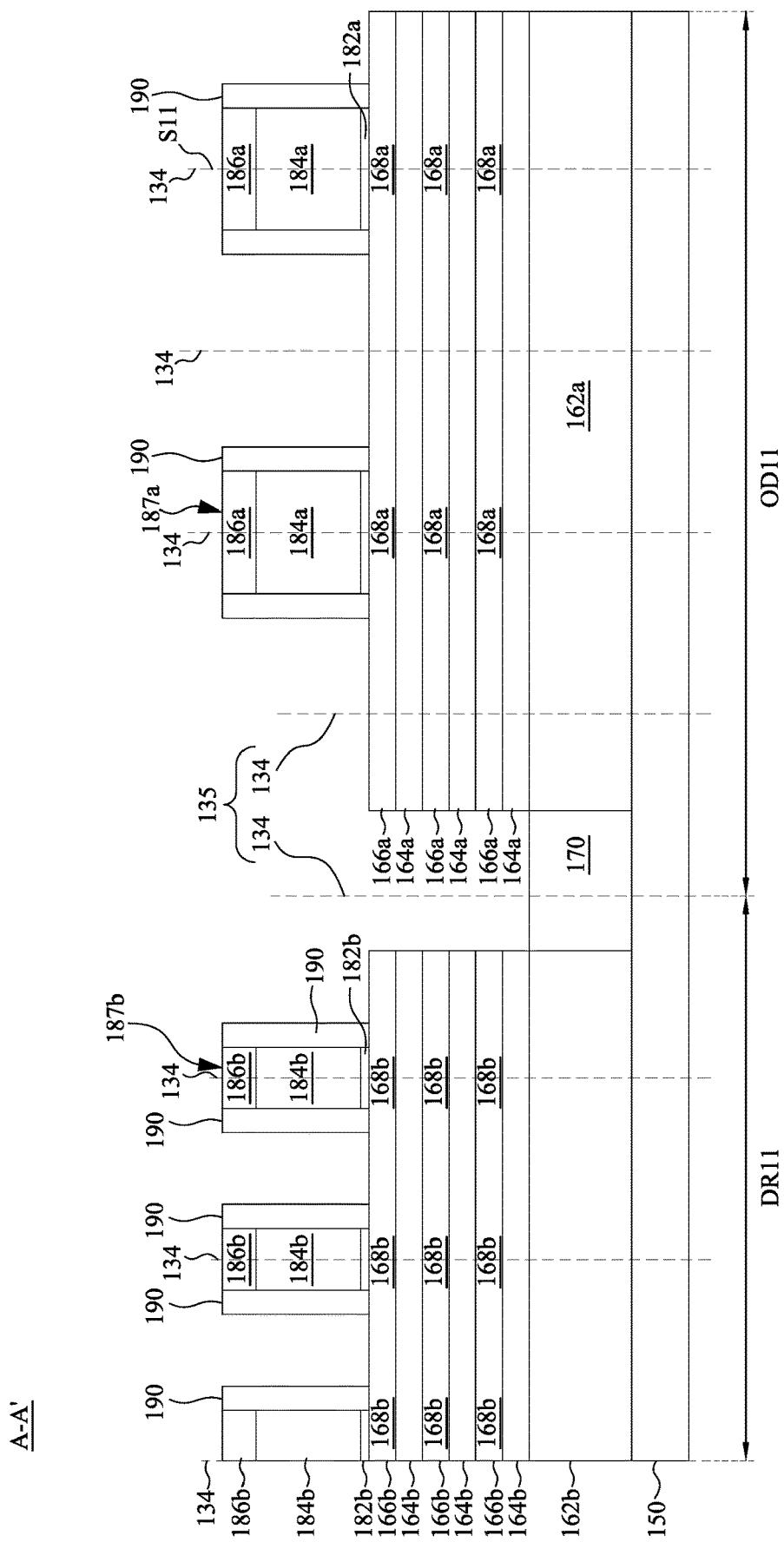

As shown in FIG. 8B, the design grid 135 may be at least formed of the vertical grid lines 134. The vertical grid lines 134 may have the uniform grid spacing GS1, which is the distance between the neighboring vertical grid lines 134. The gate strips 187a in the active region OD11 are equidistantly arranged at the gate pitch GP11 (i.e., center-to-center spacing between neighboring gate strip), and the gate strips 187b in the dummy fill region DR11 are equidistantly arranged at the gate pitch GP14 (i.e., center-to-center spacing between the neighboring gate strips). In some embodiments, all of the gate strips 187a and 187b in the active region OD11 and the dummy fill region DR11 have their longitudinal axes S11 and S13 falling on the vertical grid lines 134 for design alignment. Accordingly, the gate pitches GP11 and GP14 of the gate strips 187a and 187b in the active region OD11 and the dummy fill region DR11 are designed to be substantially equal to the integer times the grid spacing GS1. The gate pitch GP11 of the gate strips 187a in the active region OD11 may be in correlation with the gate pitch GP14 of the gate strips 187b and be integer times the gate pitch GP14 of the gate strips 187b, such as about twice of the gate pitch GP11 as shown in FIG. 9. In some embodiments, the gate pitch GP14 may be less than about three times the gate pitch GP11, such as about twice or the same.

In some embodiments, the longitudinal axis S11 of the outermost one of the gate strips 187a in the active region OD11 has a distance D11 to the longitudinal axis S13 of the gate strips 187b in the dummy fill region DR11. Because the gate strips 187a in the active regions OD11 and the gate strips 187b in the dummy fill region DR11 have their longitudinal axes S11 and S13 falling on the vertical grid lines 134, the distance D11 may be substantially equal to the integer times the grid spacing GS1, such as about three times the grid spacing GS1 as shown in FIG. 9. In some embodiments, the distance D11 may be less than about three times the grid spacing GS1, such as about twice or the same.

Referring back to FIG. 3A, the method M then proceeds to block S106 where gate spacers are formed over the nanostructures and on opposite sidewalls of each of the first gate strips in the active region and the dummy fill region. With reference to FIG. 9, in some embodiments of block S106, gate spacers 190 are formed over the nanostructures 164a, 164b, 166a, and 166b, on exposed sidewalls of the masks 186a and 186b (if present), the dummy gates 184a and the non-functional gates 184b, and the dummy dielectrics 182a and 182b. On the other hands, the outermost one of the gate strips 187a with the gate spacers 190 in the active region OD11 has a distance D13 to the gate strips 187b with the gate spacers 190 in the dummy fill region DR11, and the distance D13 may be less than about three times the grid spacing GS1.

The gate spacers 190 may be formed by conformally depositing one or more dielectric material(s) and subsequently etching the dielectric material(s). Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like; multilayers thereof; or the like. The dielectric materials may be formed by a conformal deposition process such as chemical vapor deposition (CVD), plasma enhanced chemical vapor deposition (PECVD), atomic layer deposition (ALD), or the like. In the illustrated embodiment, the gate spacers 190 each include multiple layers, e.g., a first spacer layer and a second spacer layer. In some embodiments, the first spacer layers and the second spacer layers are formed of silicon oxycarbonitride (e.g., $SiO_xN_yC_{1-x-y}$, where x and y are in the range of 0 to 1). For example, the first spacer layers can be formed of a similar or a different composition of silicon oxycarbonitride than the second spacer layers. An acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 184a and the non-functional gates 184b (thus forming the gate spacers 190). After etching, the gate spacers 190 can have straight sidewalls (as illustrated) or can have curved sidewalls (not illustrated). As will be subsequently described in greater detail, the dielectric material(s), when etched, may have portions left on the sidewalls of the fins 162a and 162b and/or the nanostructures 164a, 164b, 166a, and 166b (thus forming fin spacers).

Further, implants may be performed to form lightly doped source/drain (LDD) regions (not separately illustrated) in the active region OD11 and the dummy fill region DR11. In the embodiments with different device types, similar to the implants for the wells previously described, a mask (not separately illustrated) such as a photoresist may be at least formed over the n-type region in the active region OD11, while exposing the p-type region in the active region OD11, and appropriate type (e.g., p-type) impurities may be implanted into the fins 162a and/or the nanostructures 164a, 166a exposed in the p-type region of the active region OD11. The mask may then be removed. Subsequently, a mask (not separately illustrated) such as a photoresist may be at least formed over the p-type region in the active region OD11 while exposing the n-type region in the active region OD11, and appropriate type impurities (e.g., n-type) may be implanted into the fins 162a and/or the nanostructures 164a, 166a exposed in the n-type region in the active region OD11. The mask may then be removed. The n-type impurities may be any of the n-type impurities previously described, and the p-type impurities may be any of the p-type impurities previously described. During the implanting, the channel regions 168a in the active region OD11 and the channel regions 168b in the dummy fill region DR11 remain covered by the gate strips 187a and 187b, so that the channel regions 168a and 168b remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 10:
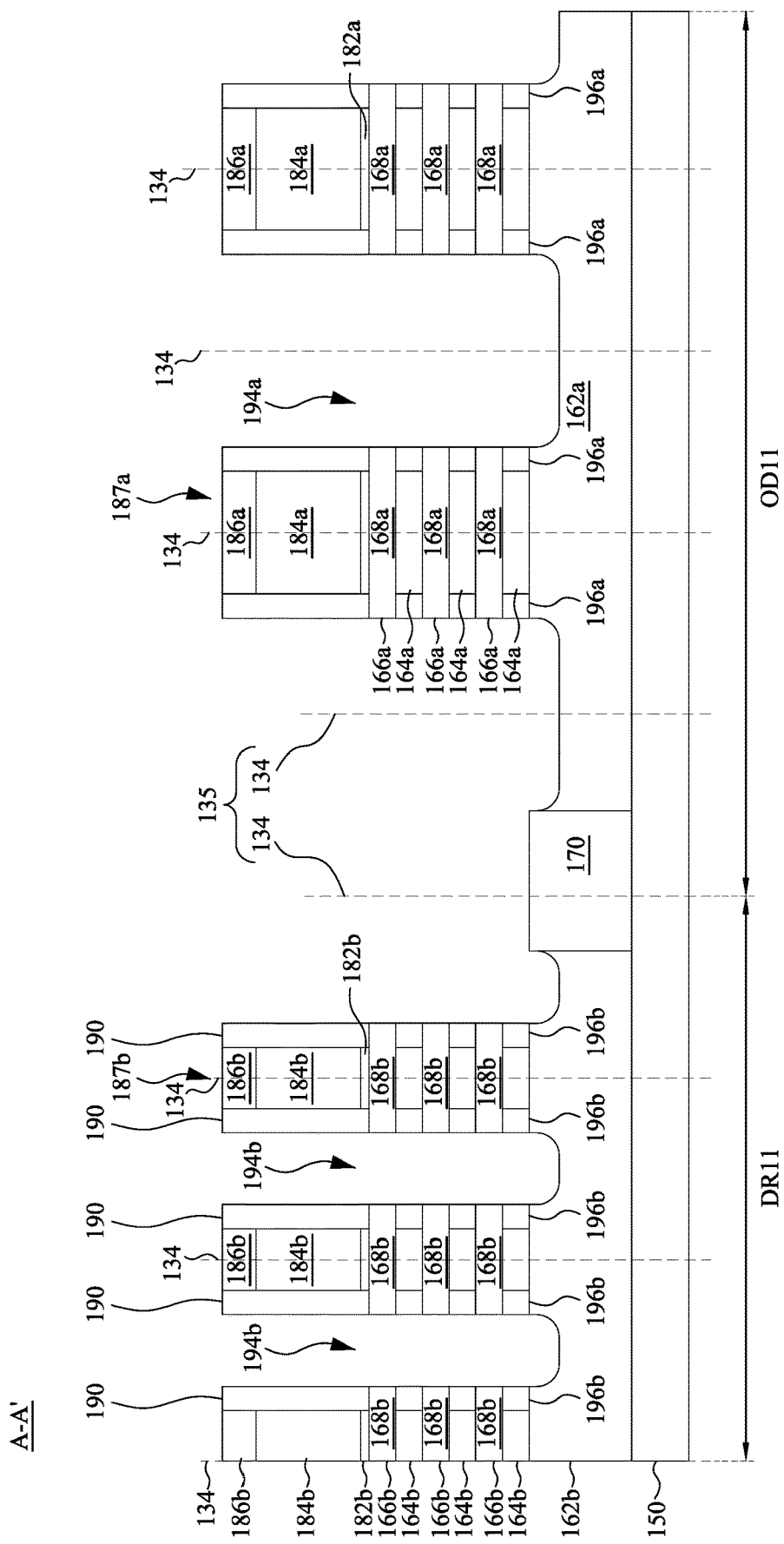

Referring back to FIG. 3A, the method M then proceeds to block S107 where source/drain recesses are formed in the nanostructures on the active region and the dummy fill region. With reference to FIG. 10, in some embodiments of block S107, source/drain recesses 194a are formed in the nanostructures 164a, 166a on the active region OD11, and source/drain recesses 194b are formed in the nanostructures 164b, 166b on the dummy fill region DR11. In the illustrated embodiment, the source/drain recesses 194a and 194b extend through the nanostructures 164a, 164b, 166a, and 166b and into the fins 162a and 162b. The source/drain recesses 194a and 194b may also extend into the substrate 150. In various embodiments, the source/drain recesses 194a and 194b may extend to a top surface of the substrate 150 without etching the substrate 150; the fins 162a, 162b may be etched such that bottom surfaces of the source/drain recesses 194a and 194b are disposed below the top surface of the STI structure 170; or the like. The source/drain recesses 194a and 194b may be formed by etching the nanostructures 164a, 164b, 166a, and 166b using an anisotropic etching processes, such as a RIE, a NBE, or the like. The gate spacers 190 and the dummy gates 184a and the non-functional gates collectively mask portions of the fins 162a, 162b and/or the nanostructures 164a, 164b, 166a, 166b during the etching processes used to form the source/drain recesses 194a and 194b. A single etch process may be used to etch each of the nanostructures 164a, 164b, 166a, and 166b, or multiple etch processes may be used to etch the nanostructures 164a, 164b, 166a, and 166b. Timed etch processes may be used to stop the etching of the source/drain recesses 194a and 194b after the source/drain recesses 194a and 194b reach a desired depth.

Referring back to FIG. 3A, the method M then proceeds to block S108 where inner spacers are formed on the sidewalls of the first nanostructures in the active region and the dummy fill region. With reference to FIG. 10, inner spacers 196a and 196b are formed on the sidewalls of the remaining portions of the first nanostructures 164a and 164b, e.g., those sidewalls exposed by the source/drain recesses 194a and 194b in the active region OD11 and the dummy fill region DR11. As will be subsequently described in greater detail, source/drain regions will be subsequently formed in the source/drain recesses 194a and 194b, and the first nanostructures 164a, 164b will be subsequently replaced with corresponding gate structures. The inner spacers 196a and 196b act as isolation features between the subsequently formed source/drain regions and the subsequently formed gate structures. Further, the inner spacers 196a and 196b may be used to substantially prevent damage to the subsequently formed source/drain regions by subsequent etching processes, such as etching processes used to subsequently remove the first nanostructures 164a and 164b.

As an example to form the inner spacers 196a and 196b, the source/drain recesses 194a and 194b can be laterally expanded. Specifically, portions of the sidewalls of the first nanostructures 164a and 164b exposed by the source/drain recesses 194a and 194b may be recessed. Although sidewalls of the first nanostructures 164a and 164b are illustrated as being straight, the sidewalls may be concave or convex. The sidewalls may be recessed by any acceptable etching process, such as one that is selective to the material of the first nanostructures 164a and 164b (e.g., selectively etches the material of the first nanostructures 164a and 164b at a faster rate than the material of the second nanostructures 166a and 166b). The etching may be isotropic. For example, when the second nanostructures 166a and 166b are formed of silicon and the first nanostructures 164a and 164b are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 194a and 194b and recess the sidewalls of the first nanostructures 164a and 164b. The inner spacers 196a and 196b can then be formed by conformally forming an insulating material and subsequently etching the insulating material. The insulating material may be silicon nitride or silicon oxynitride, although any suitable material, such as low-dielectric constant (low-k) materials having a k-value less than 3.5, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 196a and 196b are illustrated as being flush with respect to the sidewalls of the gate spacers 190, the outer sidewalls of the inner spacers 196a, 196b may extend beyond or be recessed from the sidewalls of the gate spacers 190. In other words, the inner spacers 196a and 196b may partially fill, completely fill, or overfill the sidewall recesses. Moreover, although the sidewalls of the inner spacers 196a and 196b are illustrated as being straight, the sidewalls of the inner spacers 196a and 196b may be concave or convex.

Figure 11:
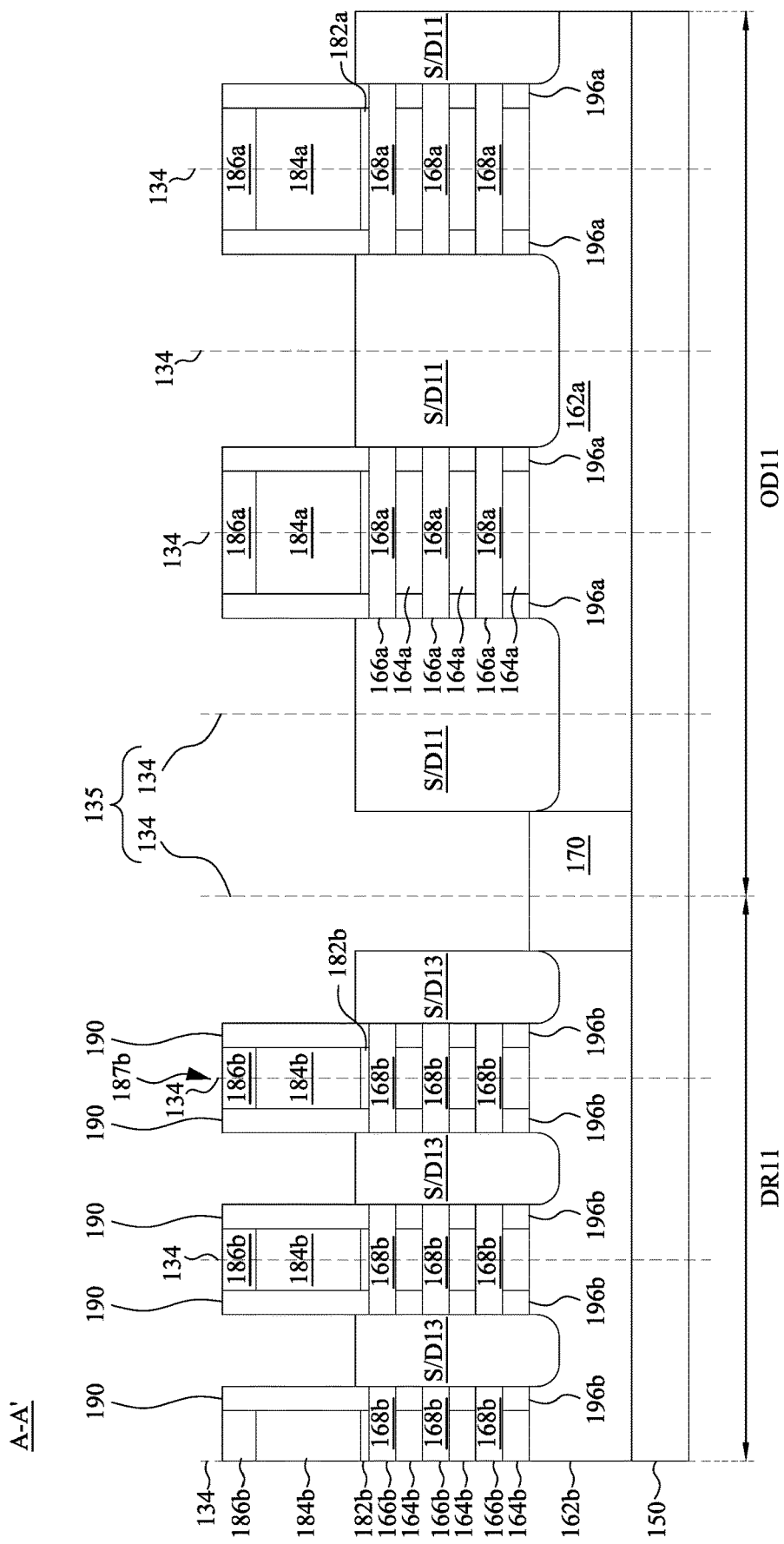

Referring back to FIG. 3B, the method M then proceeds to block S109 where epitaxial source/drain regions are formed in the source/drain recesses on the active region and the dummy fill region. With reference to FIG. 11, in some embodiments of block S109, epitaxial source/drain regions S/D11 are formed in the source/drain recesses 194a of the active region OD11, and the epitaxial source/drain regions S/D13 are formed in the source/drain recesses 194b of the dummy fill region DR11. The epitaxial source/drain regions S/D11 and S/D13 are formed in the source/drain recesses 194a and 194b such that each gate strips 187a and 187b (and corresponding channel regions 168) is disposed between respective adjacent pairs of the epitaxial source/drain regions S/D11 and S/D13. In some embodiments, the gate spacers 190 and the inner spacers 196a and 196b are used to separate the epitaxial source/drain regions S/D11 and S/D13 from, respectively, the gate strips 187a and 187b and the first nanostructures 164a, 164b by an appropriate lateral distance. A material of the epitaxial source/drain regions S/D11 and S/D13 may be selected to exert stress in the respective channel regions 168a and 168b, thereby improving performance.

The epitaxial source/drain regions S/D11 may include any acceptable material appropriate for n-type devices or p-type devices. For example, the epitaxial source/drain regions S/D11 in the n-type region may include materials exerting a tensile strain on the channel regions 168a, such as silicon, silicon carbide, phosphorous doped silicon carbide, silicon phosphide, or the like. The epitaxial source/drain regions S/D11 in the p-type region may include materials exerting a compressive strain on the channel regions 168a, such as silicon germanium, boron doped silicon germanium, germanium, germanium tin, or the like. The epitaxial source/drain regions S/D11 and S/D13 in the n-type region may have surfaces raised from respective surfaces of the fins 162a and 162b and the nanostructures 164a, 164b, 166a, 166b, and may have facets.

The epitaxial source/drain regions S/D11 and S/D13, the nanostructures 164a, 164b, 166a, 166b, and/or the fins 162a, 162b may be implanted with impurities to form source/drain regions S/D11 and S/D13, similar to the process previously described for forming LDD regions, followed by an anneal. The source/drain regions S/D11 and S/D13 may have an impurity concentration in the range of $10^{19}$ cm$^{-3}$ to $10^{21}$ cm$^{-3}$. The n-type and/or p-type impurities for source/drain regions S/D11 and S/D13 may be any of the impurities previously described. In some embodiments, the epitaxial source/drain regions S/D11 and S/D13 may be in situ doped during growth.

Figure 12:
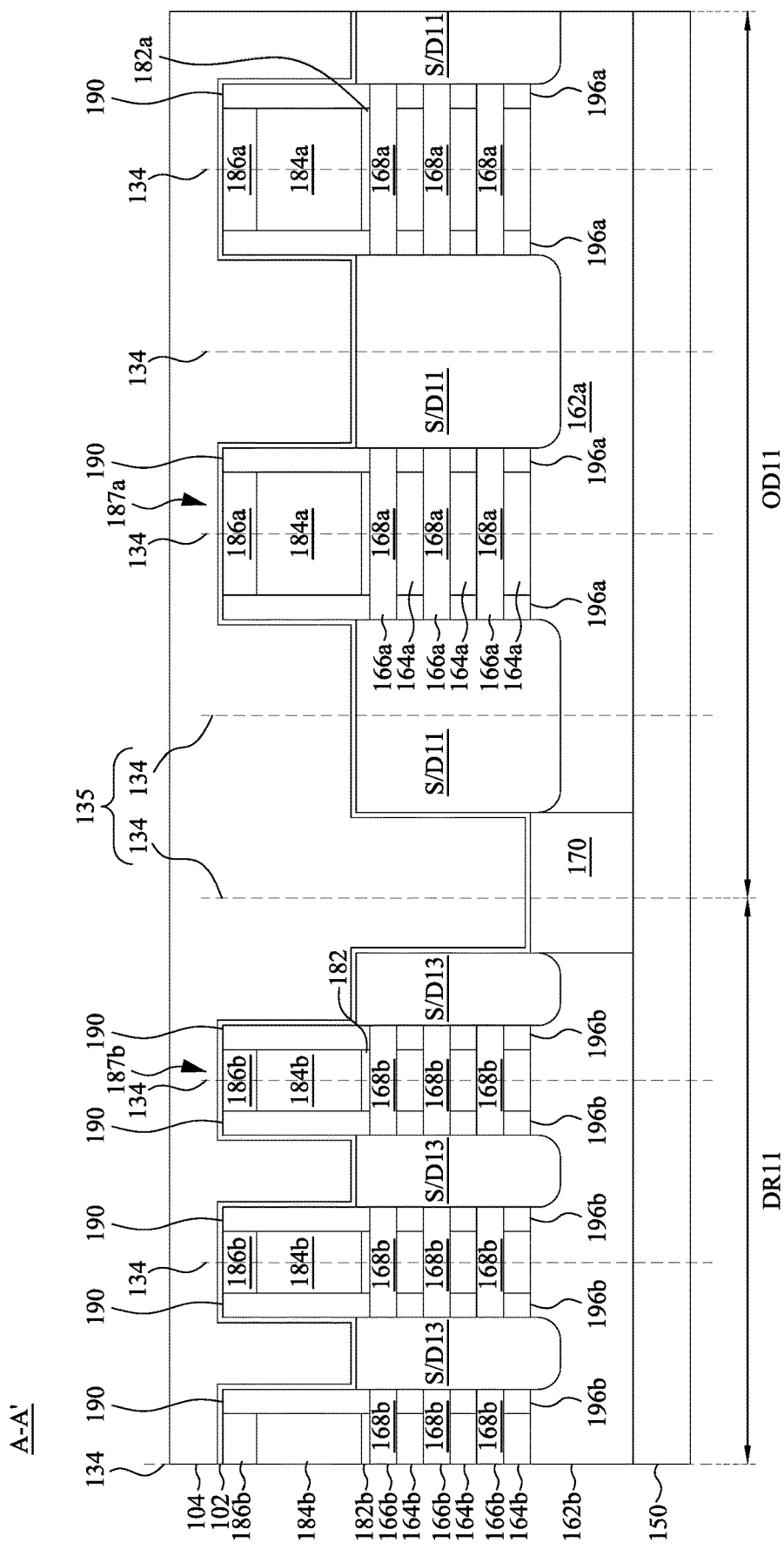

Referring back to FIG. 3B, the method M then proceeds to block S110 where an inter-layer dielectric (ILD) is deposited over the epitaxial source/drain regions, the gate spacers, and the first gate strips over the active region and the dummy fill region. With reference to FIG. 12, in some embodiments of block S110, an inter-layer dielectric (ILD) 104 is deposited over the epitaxial source/drain regions S/D11 and S/D13, the gate spacers 190, the masks 186a and 186b (if present) or the gate strips 187a and 187b. The ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the ILD 104 and the epitaxial source/drain regions S/D11 and S/D13, the gate spacers 190, and the masks 186a and 186b (if present) or the gate strips 187a and 187b. The CESL 102 may be formed of a dielectric material, such as silicon nitride, silicon oxide, silicon oxynitride, or the like, having a high etching selectivity from the etching of the ILD 104. The CESL 102 may be formed by any suitable method, such as CVD, ALD, or the like.

Figure 13:
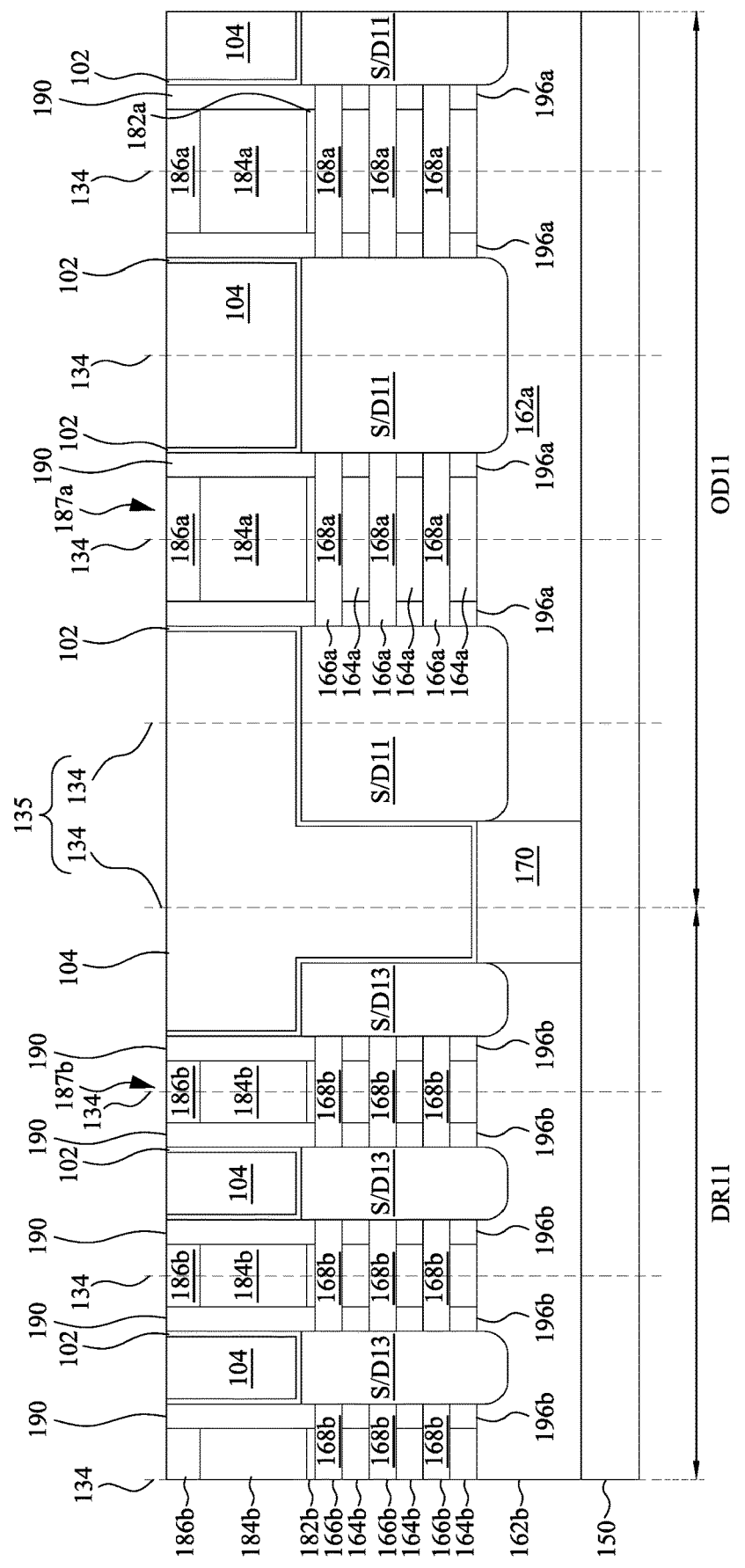

Referring back to FIG. 3B, the method M then proceeds to block S111 where a first planarization process is performed to level the top surfaces of the ILD with the top surfaces of the first gate strips. With reference to FIG. 13, in some embodiments of block S111, a planarization process P1 is performed to level the top surfaces of the ILD 104 with the top surfaces of the masks 186a and 186b (if present) or the gate strip 187a and 187b. In some embodiments, the planarization process P1 such as a chemical mechanical polish (CMP) or the like may be utilized. The planarization process P1 may also remove the masks 186a and 186b on the gate strips 187a and 187b, and portions of the gate spacers 190 along sidewalls of the masks 186a and 186b. After the planarization process P1, the top surfaces of the gate spacers 190, the ILD 104, the CESL 102, and the masks 186a and 186b (if present) or the dummy gates 184a and the non-functional gates 184b are coplanar (within process variations). Accordingly, the top surfaces of the masks 186a and 186b (if present) or the dummy gates 184a and the non-functional gates 184b are exposed through the ILD 104. In the illustrated embodiment, the masks 186a and 186b remain, and the planarization process P1 levels the top surfaces of the ILD 104 with the top surfaces of the masks 186a and 186b. Because the gate strips 187a in the active regions OD11 and the gate strips 187b in the dummy fill region DR11 respectively falling on the vertical grid lines 134 of a design grid 135, the IC structure 100 can be planarized by using the planarization process Pt more quickly, e.g., because the increased structural density reduces irregularities in surface topography, and can achieve a globally planarized surface.

Referring back to FIG. 3B, the method M then proceeds to block S112 where the first gate strips on the active region and the dummy fill region are removed to form gate trenches. With reference to FIG. 14, in some embodiments of block S112, the masks 186a and 186b (if present) and the dummy gates 184a and the non-functional gates 184b of the gate-strips 187a and 187b in the active region OD11 and the dummy fill region DR11 are removed in an etching process, so that gate trenches 110a and 110b are formed. Portions of the dummy dielectrics 182a and 182a in the gate trenches 110a and 110b are also removed. In some embodiments, the dummy gates 184a and the non-functional gates 184b are removed by an anisotropic dry etch process. For example, the etching process may include a dry etch process using reaction gas(es) that selectively etch the dummy gates 184a and the non-functional gates 184b at a faster rate than the ILD 104 or the gate spacers 190. During the removal, the dummy dielectrics 182a and 182b may be used as etch stop layers when the dummy gates 184a and the non-functional gates 184b are etched. The dummy dielectrics 182a and 182a are then removed. Each gate trenches 110a and 110b exposes and/or overlies portions of the channel regions 168a and 168b. Portions of the second nanostructures 166a and 166b which act as the channel regions 168a and 168b are disposed between adjacent pairs of the epitaxial source/drain regions S/D11 and S/D13.

The remaining portions of the first nanostructures 164a, 164b are then removed to expand the gate trenches 110a and 110b. The remaining portions of the first nanostructures 164a and 164b can be removed by any acceptable etching process that selectively etches the material of the first nanostructures 164a and 164b at a faster rate than the material of the second nanostructures 166a and 166b. The etching may be isotropic. For example, when the first nanostructures 164a and 164b are formed of silicon germanium and the second nanostructures 166a and 166b are formed of silicon, the etching process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second nanostructures 166a and 166b.

Referring back to FIG. 3B, the method M then proceeds to block S113 where a gate dielectric layer and a gate electrode layer are formed in the gate trenches on the active region and the dummy fill region. With reference to FIG. 15, in some embodiments of block S113, a gate dielectric layer 112 is formed in the gate trenches 110a and 110b on the active region OD11 and the dummy fill region DR11. A gate electrode layer 114 is formed on the gate dielectric layer 112. The gate dielectric layer 112 and the gate electrode layer 114 are layers for replacement gates, and each wrap around all (e.g., four) sides of the second nanostructures 166a, 166b.

The gate dielectric layer 112 is disposed on the sidewalls and/or the top surfaces of the fins 162a and 162b; on the top surfaces, the sidewalls, and the bottom surfaces of the second nanostructures 166a and 166b; and on the sidewalls of the gate spacers 190. The gate dielectric layer 112 may also be formed on the top surfaces of the ID 104 and the gate spacers 190. The gate dielectric layer 112 may include an oxide such as silicon oxide or a metal oxide, a silicate such as a metal silicate, combinations thereof, multi-layers thereof, or the like. The gate dielectric layer 112 may include a dielectric material having a k-value greater than 7.0, such as a metal oxide or a silicate of hafnium, aluminum, zirconium, lanthanum, manganese, barium, titanium, lead, and combinations thereof.

The gate electrode layer 114 may include a metal-containing material such as titanium nitride, titanium oxide, tantalum nitride, tantalum carbide, cobalt, ruthenium, aluminum, tungsten, zirconium aluminum carbide, hafnium aluminum carbide, niobium aluminum carbide, tantalum aluminum carbide, ZrAl, HfAl, NbAl, TaAl, ZrSiC, HfSiC, NbSiC, combinations thereof, multi-layers thereof, or the like. In some embodiments, the gate electrode layer 114 may include any number of work function tuning layers, any number of barrier layers, any number of glue layers, and a fill material.

Referring back to FIG. 3B, the method M then proceeds to block S114 where a second planarization process is performed to level the top surfaces of the gate dielectric layer and the gate electrode layer with the top surface of the ILD to form second gate strips extending over the active region and the dummy fill region. With reference to FIGS. 16A, 16B, and 16C, in some embodiments of block S114, a planarization process P2 (see FIG. 16A) is performed to level the top surfaces of the gate dielectric layer 112 and gate electrode layer 114 with the top surface of the ILD 104 over the active region OD11 and the dummy fill region DR11. As shown in FIGS. 16B and 16C, after the planarization process P2, the remaining gate electrode layer 114 and the gate dielectric layer 112 can be collectively referred to as gate strips 116. Portions of gate strips 116 formed over the active region OD11 may be acted as metal gate structures G12 as shown in FIG. 17A and other portions of gate strips 116 formed over the dummy fill region DR11 may be acted as non-functional gate structure DG11 as shown in FIG. 17A. In some embodiments, the planarization process P2 such as a chemical mechanical polish (CMP) or the like may be utilized. After the planarization process P2, the top surfaces of the gate dielectric layer 112, gate electrode layer 114, and the ILD 104 are coplanar (within process variations). Because the gate strips 116 in the active regions OD11 and the dummy fill region DR11 respectively falling on the vertical grid lines 134 of a design grid 135, the IC structure 100 can be planarized by using the planarization process P2 more quickly, e.g., because the increased structural density reduces irregularities in surface topography, and can achieve a globally planarized surface.

Referring back to FIG. 3B, the method M then proceeds to block S115 where the second gate strips are broken into separate strips to serve as metal gate structures on the active region and non-functional gate structures on the dummy fill region and block S116 where a dielectric layer is formed between the metal gate structures and the non-functional gate structures. With reference to FIGS. 17A and 17B, in some embodiments of blocks S115 and S116, fabrication of the non-functional gate structure DG11 and the metal gate structures G11 and G12 may include etching the single continuous gate strip 116 to break it into separate strips that respectively serve as the non-functional gate structure DG11 and the metal gate structures G11 and G12. In greater detail, a patterned hard mask layers (not shown) may be formed over the gate strip 116 to protect the rest of the gate strip 116 from a subsequent etching process. Subsequently, the gate dielectric layer 112 and gate electrode layer 114 of the gate strip 116 are etched to form a cut metal gate trench 113 (see FIG. 17B) extending down to the STI structure 170 to break the gate strip 116 as shown in FIG. 16C. Therefore, the gate strips 116 remained on the active region OD12 can be referred to as metal gate structures G12, and the gate strips 116 remained on the dummy fill region DR11 can be referred to as non-functional gate structures DG11. In some embodiments, the etching process may use one or more etchants or a mixture of etchants.

Subsequently, one or more dielectric materials fills the cut metal gate trench 113 to form the dielectric layer 115. Therefore, the dielectric layer 115 is formed between the metal gate structures G12 and the non-functional gate structures DG11 and in parallel with the fins 162b. In some embodiments, the dielectric layer 115 may include SiOx, SiON, $Si_3N_4$, SiOCN, SIC, SiGe, metals, or combinations thereof. In some embodiments, the dielectric layer 115 may include air-gap. In some embodiments, the dielectric layer 115 may be made of fluoride-doped silicate glass (FSG), or other low-K dielectric materials. In some embodiments, the dielectric layer 115 may be formed using a high-density-plasma (HDP) chemical vapor deposition (CVD) process, using silane ($SiH_4$) and oxygen ($O_2$) as reacting precursors. In some other embodiments, the dielectric layer 115 may be formed using a sub-atmospheric CVD (SACVD) process or high aspect-ratio process (HARP), wherein process gases may comprise tetraethylorthosilicate (TEOS) and ozone ($O_3$). In yet other embodiments, the dielectric layer 115 may be formed using a spin-on-dielectric (SOD) process, such as hydrogen silsesquioxane (HSQ) or methyl silsesquioxane (MSQ). Other processes and materials may be used. In some embodiments, the dielectric layer 115 can have a multi-layer structure, for example, a thermal oxide liner layer with silicon nitride formed over the liner. Thereafter, a thermal annealing may be optionally performed to the dielectric layer 115. Subsequently, one or more CMP processes is performed to remove excessive dielectric layer 115 (the portion outside the cut metal gate trench 113) and the hard mask layers (not shown). The resulting structure is shown in FIGS. 17A and 17B.

Figure 18:
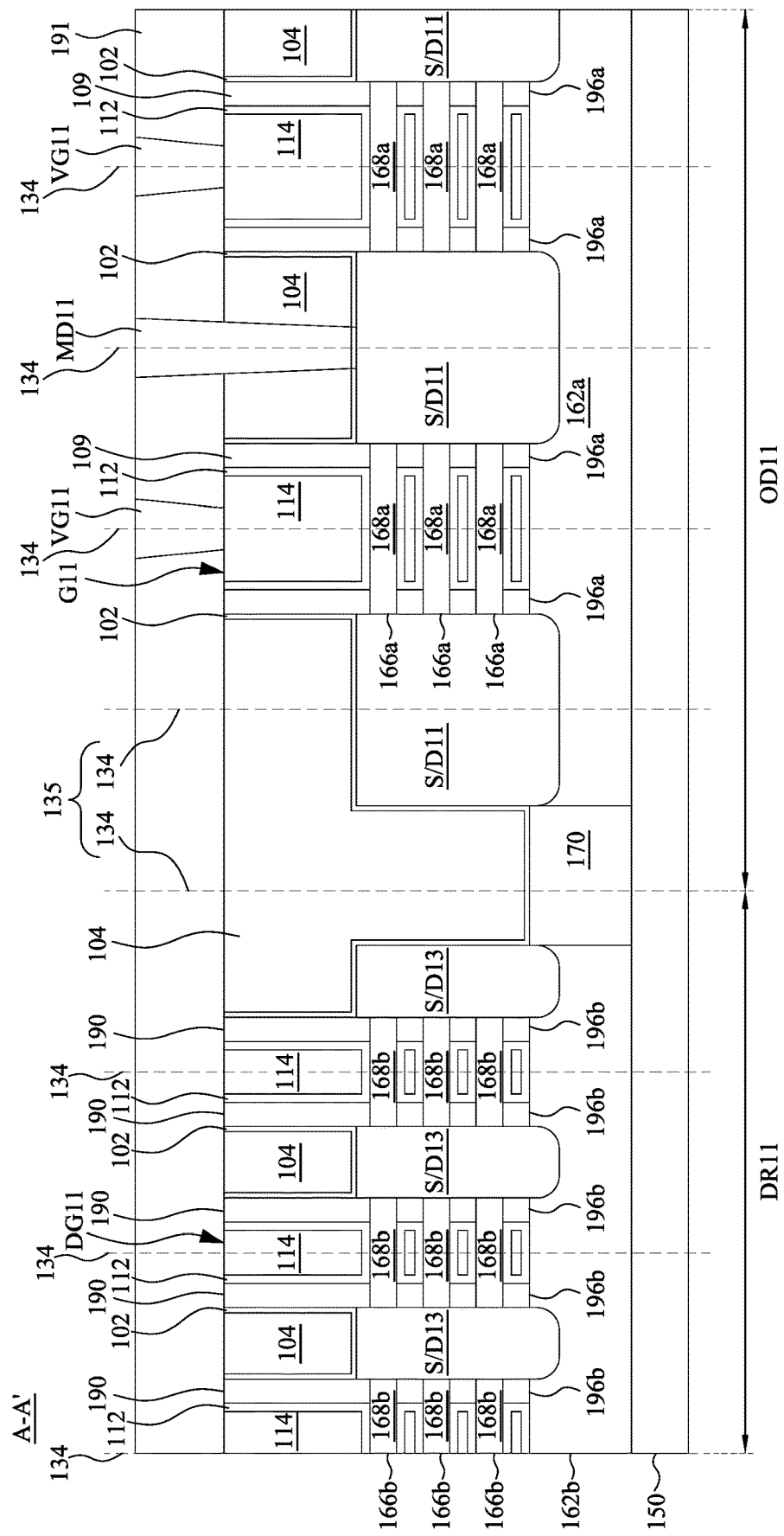

Referring back to FIG. 3B, the method M then proceeds to block S117 where a gate contact and a source/drain contact are formed on the metal gate structure and the epitaxial source/drain region over the active region. With reference to FIG. 18, in some embodiments of block S117, an interlayer dielectric (ILD) 191 is formed over the metal gate structures G11 and the non-functional gate structures DG11. The ILD 191 is made of silicon oxide, silicon nitride, silicon oxynitride, fluoride-doped silicate glass (FSG), or other low-K dielectric materials. In some embodiments, the ILD 191 may be formed using a high-density-plasma (HDP) chemical vapor deposition (CVD) process, using silane ($SiH_4$) and oxygen ($O_2$) as reacting precursors. In some other embodiments, the isolation ILD 191 may be formed using a sub-atmospheric CVD (SACVD) process or high aspect-ratio process (HARP), in which process gases may include tetraethylorthosilicate (TEOS) and ozone ($O_3$). In yet other embodiments, the ILD 191 may be formed using a spin-on-dielectric (SOD) process, such as hydrogen silsesquioxane (HSQ) or methyl silsesquioxane (MSQ). Other processes and materials may be used. In some embodiments, the ILD 191 can have a multi-layer structure, by way of example and not limitation, a thermal oxide liner layer with silicon nitride formed over the liner. Thereafter, a thermal annealing may be optionally performed to the ILD 191.

First and second contact holes may be formed by any suitable process in the ILDs 104 and 191 to expose the metal gate structures G11 and the epitaxial source/drain region S/D11. Subsequently, a conductive material layer fills in the first and second contact holes. In some embodiments, the conductive material layer includes TiN, TaN, Ta, Ti, Hf, Zr, Ni, W, Co, Cu, Ag, Al, Zn, Ca, Au, Mg, Mo, Cr, or the like. In some embodiments, the conductive material layer may be formed by CVD, PVD, plating, ALD, or other suitable technique. Subsequently, a planarization process such as chemical mechanical polish (CMP) is performed to remove a portion of the conductive material layer above a top surface of the ILD 191. After planarization, a gate contact VG11 and a source/drain contact MD11 are formed. The gate contact VG11 goes through the ILD 191 to provide electrical contact to the metal gate structures G11, and the source/drain contact MD11 goes through the ILDs 104 and 191 to provide electrical contact to the epitaxial source/drain region S/D11.

In order to reducing process variations in the IC structure, dummy patterns are inserted into IC structure to reduce pattern loading effect. For example, dummy fill region with non-functional gate structures may be inserted into the IC structure to create more uniform density of active areas in the IC structure. However, in current gate layout design, metal gate structures may not be uniformly distributed. For example, some metal gate structures with narrower gate width are routed on-grid (i.e., aligned with grid lines), but others metal gate structures with wider gate width are routed off-grid (i.e., offset from grid lines). In order to avoid collision between the non-functional gate structures and the off-grid wider metal gate structures, the dummy fill region may be set farther away from the off-grid metal gate structures and thus results in a large gate-free region separating the off-grid gates and the dummy fill region, which in turn aggravates the CMP loading effect. For example, the CMP serving to remove excessive metal gate materials may result in more dishing in pattern-sparse regions (e.g., the large gate-free region between the off-grid gates and the dummy fill region) than in pattern-dense region (e.g., gate-to-gate region between neighboring gates).

Based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides the wider metal gate structures and the narrower gate structures both routed on grid. As a result, the dummy fill region can be set close to the wider gate structures, which in turn reduces the gate-free region between the dummy fill region and the wider gate structures, thus reducing the CMP loading effect.

In some embodiments, the integrated circuit (IC) structure includes a semiconductor substrate, a first active region, a dummy fill region, a second active region, first metal gate structures, and second metal gate structures. The first active region is on the semiconductor substrate. The dummy fill region is on the semiconductor substrate. The second active region is on the semiconductor substrate and spaced apart from the first active region by the dummy fill region. The first metal gate structures extend in the first active region and have a first gate pitch and a first gate width. The second metal gate structures extend in the second active region and have a second gate width greater than the first gate width and a second gate pitch being an integer times the first gate pitch, and the integer being two or more. In some embodiments, one of longitudinal axes of the plurality of first metal gate structures is laterally offset from one of longitudinal axes of the plurality of second metal gate structures by a distance that is a second integer times the first gate pitch. In some embodiments, the IC structure further includes a plurality of non-functional gate structures extending in the dummy fill region and between the first and second active regions, one of longitudinal axes of the plurality of non-functional gate structures being laterally offset from one of longitudinal axes of the plurality of first metal gate structures by a distance that is a second integer times the first gate pitch. In some embodiments, the IC structure further includes a plurality of non-functional gate structures extending in the dummy fill region and between the first and second active regions, one of longitudinal axes of the plurality of non-functional gate structures being laterally offset from one of longitudinal axes of the plurality of second metal gate structures by a distance that is a second integer times the first gate pitch. In some embodiments, the IC structure further includes a plurality of non-functional gate structures extending in the dummy fill region and between the first and second active regions, the plurality of non-functional gate structures having a third gate pitch the same as the first gate pitch of the plurality of first metal gate structures. In some embodiments, the IC structure further includes a plurality of non-functional gate structures extending in the dummy fill region and between the first and second active regions, the plurality of non-functional gate structures having a third gate pitch, wherein the second gate pitch of the plurality of second metal gate structures is a second integer times the third gate pitch, the second integer times being same as the first integer. In some embodiments, the IC structure further includes a plurality of non-functional gate structures extending in the dummy fill region, longitudinal axes of the plurality of non-functional gate structures being aligned with longitudinal axes of the plurality of first metal gate structures, the plurality of non-functional gate structures having a third gate width the same as the first gate width of the plurality of first metal gate structures. In some embodiments, the IC structure further includes a plurality of non-functional gate structures extending in the dummy fill region, longitudinal axes of the plurality of non-functional gate structures being aligned with longitudinal axes of the plurality of first metal gate structures, the plurality of non-functional gate structures having a third gate width less than the second gate width of the plurality of second metal gate structures. In some embodiments, the IC structure further includes a plurality of non-functional gate structures extending in the dummy fill region, longitudinal axes of the plurality of non-functional gate structures being aligned with longitudinal axes of the plurality of second metal gate structures, the plurality of non-functional gate structures having a third gate width less than the second gate width of the plurality of second metal gate structures. In some embodiments, the IC structure further includes a plurality of non-functional gate structures extending in the dummy fill region, longitudinal axes of the plurality of non-functional gate structures being aligned with longitudinal axes of the plurality of second metal gate structures, the plurality of non-functional gate structures having a third gate width the same as the first gate width of the plurality of first metal gate structures.

In some embodiments, the integrated circuit (IC) structure includes a semiconductor substrate, an active region, a dummy fill region, metal gate structures, and non-functional gate structures. The active region is on the semiconductor substrate. The dummy fill region is on the semiconductor substrate, surrounds the active region, and is free of functional transistors. The metal gate structures extend in the active region and have a first gate pitch. The first non-functional gate structures extend in the dummy fill region and have a second gate pitch. The first gate pitch is a first integer times the second gate pitch. The first integer is two or more. One of longitudinal axes of the plurality of first non-functional gate structures is laterally offset from one of longitudinal axes of the plurality of metal gate structures by a distance that is a second integer times the second gate pitch. In some embodiments, the plurality of metal gate structures have a first gate width, the plurality of first non-functional gate structures have a second gate width, and the first gate width is greater than the second gate width. In some embodiments, the plurality of metal gate structures have a first gate length, the plurality of first non-functional gate structures have a second gate length, and the second gate length is greater than the first gate length. In some embodiments, the first non-functional gate structures are free of gate contacts. In some embodiments, the IC structure further includes a plurality of second non-functional gate structures extending in the dummy fill region, longitudinal axes of the plurality of second non-functional gate structures being aligned with the longitudinal axes of the plurality of metal gate structures. In some embodiments, the second non-functional gate structures have a third gate width, the third gate width is less than a first gate width of the plurality of metal gate structures.

In some embodiments, the method includes forming a plurality of first fin structures on a first active region of a semiconductor substrate, the plurality of first fin structures each having alternating first and second semiconductor layers; forming a plurality of second fin structures over a second active region of the semiconductor substrate, the plurality of second fin structures each having alternating third and fourth semiconductor layers; removing the first and third semiconductor layers, such that the second and fourth semiconductor layers are suspended over the semiconductor substrate; forming a plurality of first metal gate structures surrounding each of the suspended second semiconductor layers, and a plurality of second metal gate structures surrounding each of the suspended fourth semiconductor layers, wherein the plurality of first metal gate structures have a first gate pitch, the plurality of second metal gate structures have a second gate pitch, and the second gate pitch is a first integer times the first gate pitch, and the first integer is two or more. In some embodiments, the plurality of first metal gate structures have a first gate width, the plurality of second metal gate structures have a second gate width, and the second gate width is greater than the first gate width. In some embodiments, one of longitudinal axes of the plurality of second metal gate structures is laterally offset from one of longitudinal axes of the plurality of first metal gate structures by a distance that is a second integer times the second gate pitch. In some embodiments, the first and second metal gate structures comprise the same material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a plurality of first fin structures on a first active region of a semiconductor substrate, the plurality of first fin structures each having alternating first and second semiconductor layers;
    forming a plurality of second fin structures over a second active region of the semiconductor substrate, the plurality of second fin structures each having alternating third and fourth semiconductor layers;
    removing the first and third semiconductor layers, such that the second and fourth semiconductor layers are suspended over the semiconductor substrate, wherein the second and fourth semiconductor layers each has a maximum dimension extending in a first direction from a top view; and
    forming a plurality of first metal gate structures surrounding each of the suspended second semiconductor layers, and a plurality of second metal gate structures surrounding each of the suspended fourth semiconductor layers, wherein the first and second gate structures each has a maximum dimension extending in a second direction from the top view, the second direction is perpendicular to the first direction, wherein the plurality of first metal gate structures have a first gate pitch, the plurality of second metal gate structures have a second gate pitch, the first gate pitch is a center-to-center distance between two adjacent first metal gate structures in the first direction, the second gate pitch is a center-to-center distance between two adjacent second metal gate structures in the first direction, and the second gate pitch is a first integer times the first gate pitch, and the first integer is two or more, and
    wherein from a cross-sectional view taken along the first direction, one of the second semiconductor layers has opposing ends that respectively extends beyond opposing longitudinal sides of a corresponding one of the first metal gate structures in the first direction to directly contact source/drain regions.

2. The method of claim 1, wherein the plurality of first metal gate structures have a first gate width, the plurality of second metal gate structures have a second gate width, and the second gate width is greater than the first gate width.

3. The method of claim 1, wherein one of longitudinal axes of the plurality of second metal gate structures is laterally offset from one of longitudinal axes of the plurality of first metal gate structures by a distance that is a second integer times the second gate pitch.

4. A method, comprising:
    forming a plurality of first semiconductor layers on a first active region that is on a semiconductor substrate, wherein the first semiconductor layers are stacked in a vertical direction;
    forming a plurality of second semiconductor layers on a second active region that is on the semiconductor substrate, and the second active region being spaced apart from the first active region by a dummy fill region, wherein the dummy fill region is on the semiconductor substrate and free of functional transistors, the second semiconductor layers are stacked in the vertical direction, and the first and second semiconductor layers each has a maximum dimension extending in a first direction from a top view;
    forming a plurality of first metal gate structures surrounding each of the first semiconductor layers, wherein the first metal gate structures each has a maximum dimension extending in a second direction from the top view, the second direction is perpendicular to the first direction, and the first metal gate structures have a first gate pitch and a first gate width in the first direction, wherein from a cross-sectional view taken along the first direction, the maximum dimension of one of the first semiconductor layers is greater than a maximum lateral dimension of a corresponding one of the first metal gate structures, wherein the maximum lateral dimension is a distance between opposing sidewalls of the corresponding one of the first metal gate structures measured in the first direction; and
    forming a plurality of second metal gate structures surrounding each of the second semiconductor layers, wherein the second metal gate structures each has a maximum dimension extending in the second direction, and the second metal gate structures have a second gate pitch and a second gate width in the first direction,
    wherein the second gate width is greater than the first gate width, the second gate pitch is a first integer times the first gate pitch, and the first integer is two or more than two.

5. The method of claim 4, wherein one of longitudinal axes of the plurality of first metal gate structures is laterally offset from one of longitudinal axes of the plurality of second metal gate structures by a distance that is a second integer times the first gate pitch.

6. The method of claim 4, further comprising:
    forming a plurality of non-functional gate structures extending in the dummy fill region and between the first and second active regions, wherein one of longitudinal axes of the plurality of non-functional gate structures is laterally offset from one of longitudinal axes of the plurality of first metal gate structures by a distance, and the distance is a second integer times the first gate pitch.

7. The method of claim 4, further comprising:
forming a plurality of non-functional gate structures extending in the dummy fill region and between the first and second active regions, wherein one of longitudinal axes of the plurality of non-functional gate structures is laterally offset from one of longitudinal axes of the plurality of second metal gate structures by a distance, and the distance is a second integer times the first gate pitch.

8. The method of claim 4, further comprising:
forming a plurality of non-functional gate structures extending in the dummy fill region and between the first and second active regions, wherein the plurality of non-functional gate structures have a third gate pitch, and the third gate pitch is the same as the first gate pitch of the plurality of first metal gate structures.

9. The method of claim 4, further comprising:
forming a plurality of non-functional gate structures extending in the dummy fill region and between the first and second active regions, wherein the plurality of non-functional gate structures have a third gate pitch, the second gate pitch of the plurality of second metal gate structures is a second integer times the third gate pitch, and the second integer times being same as the first integer.

10. A method, comprising:
forming a plurality of first semiconductor layers on an active region that is on a semiconductor substrate, wherein the first semiconductor layers are stacked in a vertical direction, and the first semiconductor layers each has a maximum dimension extending in a first direction from a top view;
forming a plurality of metal gate structures surrounding each of the first semiconductor layers, wherein the metal gate structures each has a maximum dimension extending in a second direction from a top view, the second direction is perpendicular to the first direction, the metal gate structures have a first gate pitch, the first gate pitch is a center-to-center distance between two adjacent metal gate structures in the first direction, wherein from a cross-sectional view taken along the first direction, the maximum dimension of one of the first semiconductor layers is greater than a maximum lateral dimension of a corresponding one of the metal gate structures, wherein the maximum lateral dimension is a distance between opposing sidewalls of the corresponding one of the metal gate structures measured in the first direction;
forming a plurality of second semiconductor layers on a dummy fill region, wherein the second semiconductor layers are stacked in the vertical direction, and the second semiconductor layers each has a maximum dimension extending in the first direction;
forming a plurality of first non-functional gate structures surrounding each of the second semiconductor layers, wherein the first non-functional gate structures each has a maximum dimension extending in the second direction,
wherein the dummy fill region is on the semiconductor substrate and surrounds the active region, the dummy fill region is free of functional transistors, the first non-functional gate structures have a second gate pitch, the second gate pitch being a center-to-center distance between two adjacent first non-functional gate structures in the first direction, the first gate pitch of the metal gate structures is a first integer times the second gate pitch of the first non-functional gate structures, and the first integer is two or more than two, one of longitudinal axes of the plurality of first non-functional gate structures is laterally offset from one of longitudinal axes of the plurality of metal gate structures in the first direction by a distance, and the distance is a second integer times the second gate pitch;
forming a first source/drain region interfacing a first end of the one of the first semiconductor layers; and
forming a second source/drain region interfacing a second end, opposing to the first end, of the one of the first semiconductor layers, wherein from the cross-sectional view taken along the first direction, the maximum dimension of the one of the first semiconductor layers is a distance between the first and second source/drain regions.

11. The method of claim 10, wherein the plurality of metal gate structures have a first gate width, the plurality of first non-functional gate structures have a second gate width, and the first gate width is greater than the second gate width.

12. The method of claim 10, further comprising:
forming a plurality of second non-functional gate structures extending in the dummy fill region, wherein longitudinal axes of the plurality of second non-functional gate structures are aligned with the longitudinal axes of the plurality of metal gate structures.

13. The method of claim 12, wherein the second non-functional gate structures have a third gate width, the third gate width is less than a first gate width of the plurality of metal gate structures.

14. The method of claim 1, wherein from the top view, the first metal gate structures each has a first side extending in the first direction and a second side connecting to the first side and extending in the second direction, and the second side has a greater dimension than the first side.

15. The method of claim 4, wherein the first semiconductor layers are spaced apart from each other in the vertical direction, and the second semiconductor layers are spaced apart from each other in the vertical direction.

16. The method of claim 1, wherein from the cross-sectional view taken along the first direction, the maximum dimension of one of the second semiconductor layers is greater than a lateral dimension of a corresponding one of the second metal gate structures.

17. The method of claim 4, wherein from the cross-sectional view taken along the first direction, one of the second semiconductor layers has opposing ends that respectively extends beyond opposing longitudinal sides of a corresponding one of the second metal gate structures in the first direction.

18. The method of claim 1, wherein from the cross-sectional view taken along the first direction, the maximum dimension of the one of the second semiconductor layers is greater than a maximum lateral dimension of the corresponding one of the first metal gate structures, and the maximum lateral dimension is a distance between opposing sidewalls of the corresponding one of the first metal gate structures measured in the first direction.

19. The method of claim 4, wherein from the cross-sectional view taken along the first direction, one of the first semiconductor layers has opposing ends that respectively extends beyond opposing longitudinal sides of the corresponding one of the first metal gate structures in the first direction to directly contact source/drain regions.

20. The method of claim 10, wherein from the cross-sectional view taken along the first direction, one of the first semiconductor layers has opposing ends that respectively extends beyond opposing longitudinal sides of the corresponding one of the metal gate structures in the first direction to directly contact the first and second source/drain regions.

\* \* \* \* \*